(12) United States Patent
Chen et al.

(10) Patent No.: US 11,011,679 B2
(45) Date of Patent: May 18, 2021

(54) OPTOELECTRONIC DEVICE AND METHOD FOR MANUFACTURING THE SAME

(71) Applicant: EPISTAR CORPORATION, Hsinchu (TW)

(72) Inventors: Chao-Hsing Chen, Hsinchu (TW); Jia-Kuen Wang, Hsinchu (TW); Chien-Chih Liao, Hsinchu (TW); Tzu-Yao Tseng, Hsinchu (TW); Tsun-Kai Ko, Hsinchu (TW); Chien-Fu Shen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/703,419

(22) Filed: Dec. 4, 2019

(65) Prior Publication Data

US 2020/0111935 A1    Apr. 9, 2020

Related U.S. Application Data

(63) Continuation of application No. 15/820,002, filed on Nov. 21, 2017, now Pat. No. 10,529,893, which is a (Continued)

(30) Foreign Application Priority Data

Jul. 3, 2014   (TW) .................................. 103123102

(51) Int. Cl.
*H01L 33/38*   (2010.01)
*H01L 33/40*   (2010.01)

(52) U.S. Cl.
CPC ............ *H01L 33/38* (2013.01); *H01L 33/382* (2013.01); *H01L 33/387* (2013.01); *H01L 33/405* (2013.01)

(58) Field of Classification Search
CPC ...... H01L 33/38; H01L 33/382; H01L 33/387
See application file for complete search history.

(56) References Cited

U.S. PATENT DOCUMENTS

| 6,573,537 B1 | 6/2003 | Steigerwald et al. |
| 7,982,236 B2 | 7/2011 | Sano et al. |

(Continued)

FOREIGN PATENT DOCUMENTS

| CN | 102169940 A | 8/2011 |
| CN | 103500790 A | 1/2014 |

(Continued)

*Primary Examiner* — Grant S Withers
(74) *Attorney, Agent, or Firm* — Muncy, Geissler, Olds & Lowe, P.C.

(57) ABSTRACT

An optoelectronic device, comprising a first semiconductor layer comprising four boundaries comprising two longer sides and two shorter sides; a second semiconductor layer formed on the first semiconductor layer; and a plurality of first conductive type electrodes formed on the first semiconductor layer, wherein one first part of the plurality of first conductive type electrodes is formed on a corner constituted by one of the two longer sides and one of the two shorter sides, and wherein one fourth part of the plurality of first conductive type electrodes is formed along the one of the two longer sides, the one fourth part of the plurality of first conductive type electrodes comprises a head portion and a tail portion, the head portion comprises a width larger than that of the tail portion.

18 Claims, 19 Drawing Sheets

Related U.S. Application Data continuation of application No. 14/791,949, filed on Jul. 6, 2015, now Pat. No. 9,859,467.

(56) References Cited

U.S. PATENT DOCUMENTS

| | | |
|---|---|---|
| 8,309,971 B2 | 11/2012 | Seo et al. |
| 8,552,447 B2 | 10/2013 | Yahata et al. |
| 8,669,582 B2 | 3/2014 | Na et al. |
| 9,041,033 B2 | 5/2015 | Akimoto et al. |
| 9,466,768 B2 | 10/2016 | Jeon et al. |
| 2005/0104220 A1 | 5/2005 | Tsuchiya et al. |
| 2005/0179130 A1 | 8/2005 | Tanaka et al. |
| 2008/0185606 A1 | 8/2008 | Sano et al. |
| 2008/0258174 A1 | 10/2008 | Seong |
| 2012/0326171 A1 | 12/2012 | Lee et al. |
| 2013/0146929 A1 | 6/2013 | Kim et al. |
| 2014/0001502 A1* | 1/2014 | Akimoto ............... H01L 33/382 257/98 |
| 2014/0054633 A1 | 2/2014 | Kim |
| 2014/0159091 A1 | 6/2014 | Hon et al. |
| 2014/0191277 A1 | 7/2014 | Chen et al. |
| 2015/0236215 A1 | 8/2015 | Park et al. |

FOREIGN PATENT DOCUMENTS

| | | |
|---|---|---|
| JP | 2008210903 A | 9/2008 |
| JP | 2014011275 A | 1/2014 |
| JP | 2014093509 A | 5/2014 |
| KR | 100814464 B1 | 3/2008 |
| KR | 20120086876 A | 8/2012 |
| KR | 20120136814 A | 12/2012 |
| KR | 101368720 B1 | 3/2014 |
| TW | 201128805 A1 | 8/2011 |
| TW | 201427075 A | 7/2014 |

\* cited by examiner

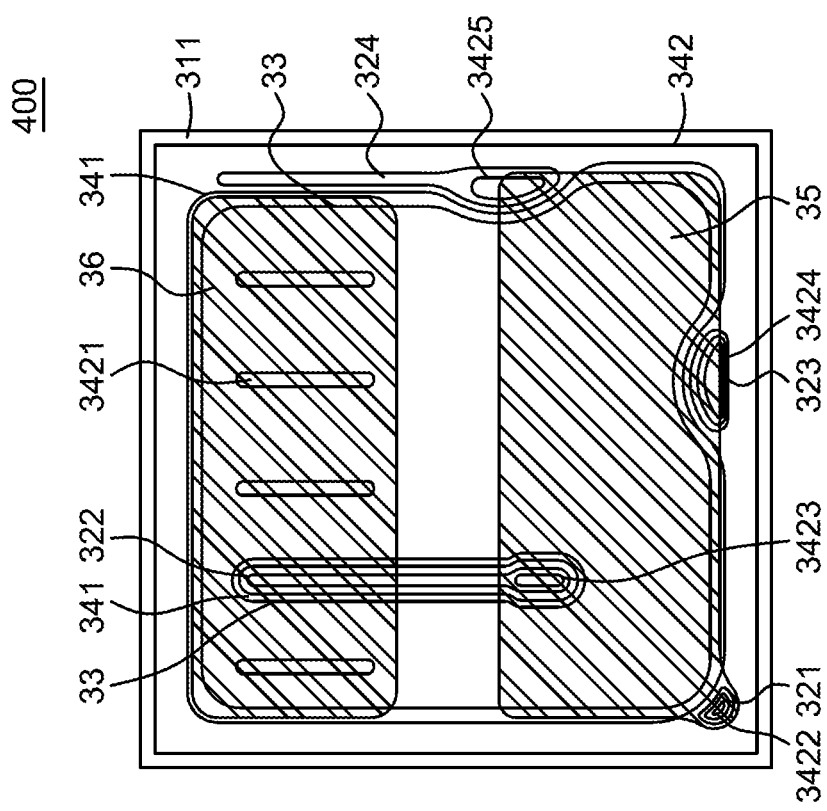
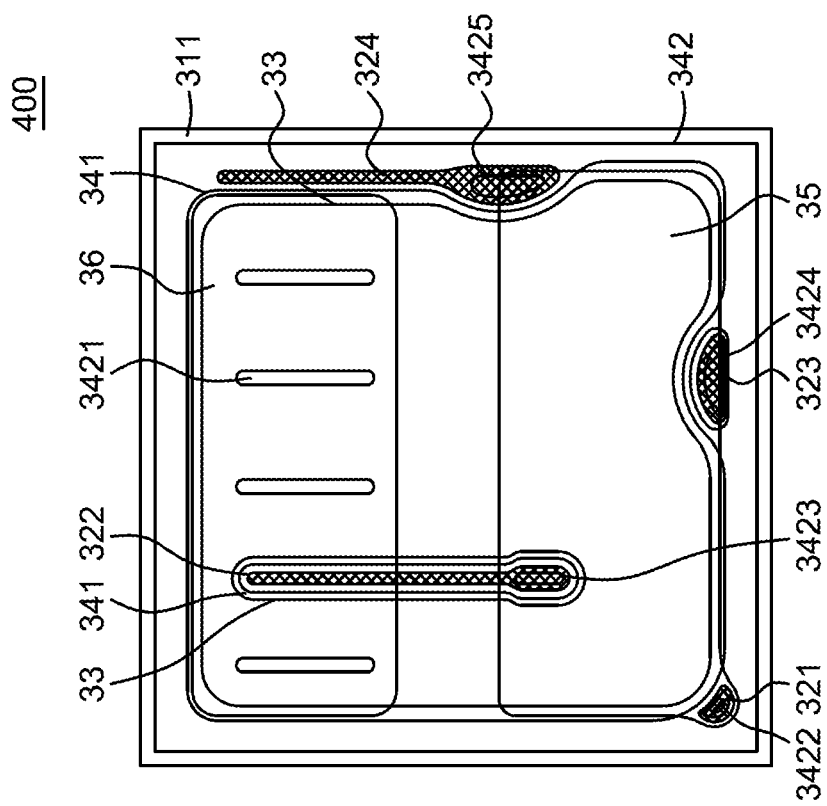
FIG. 3H
FIG. 3G

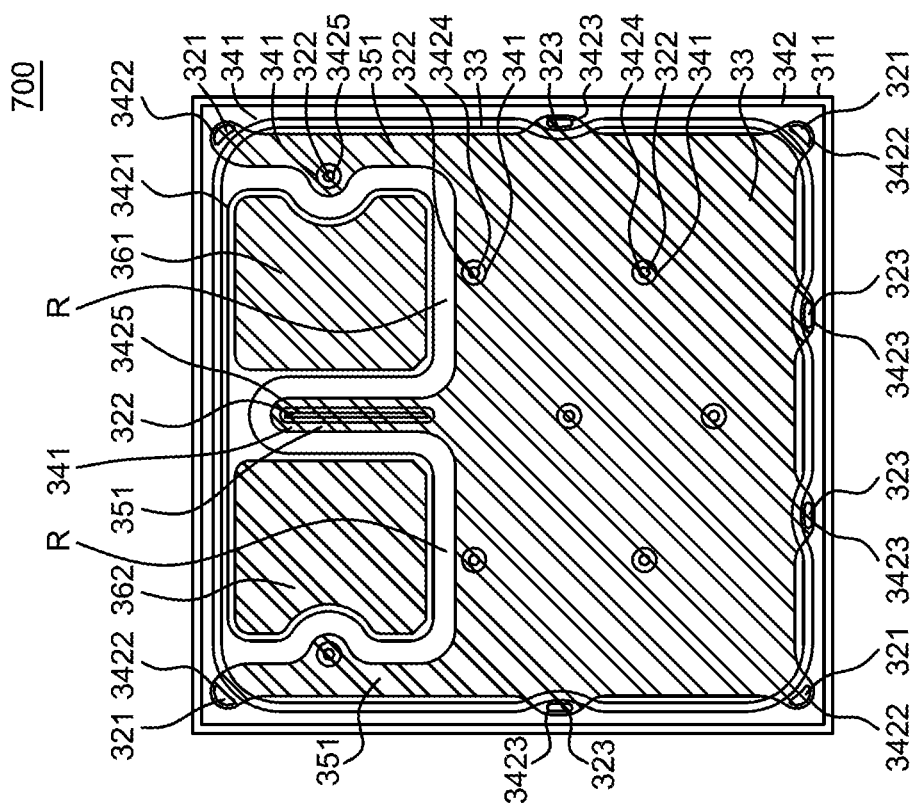
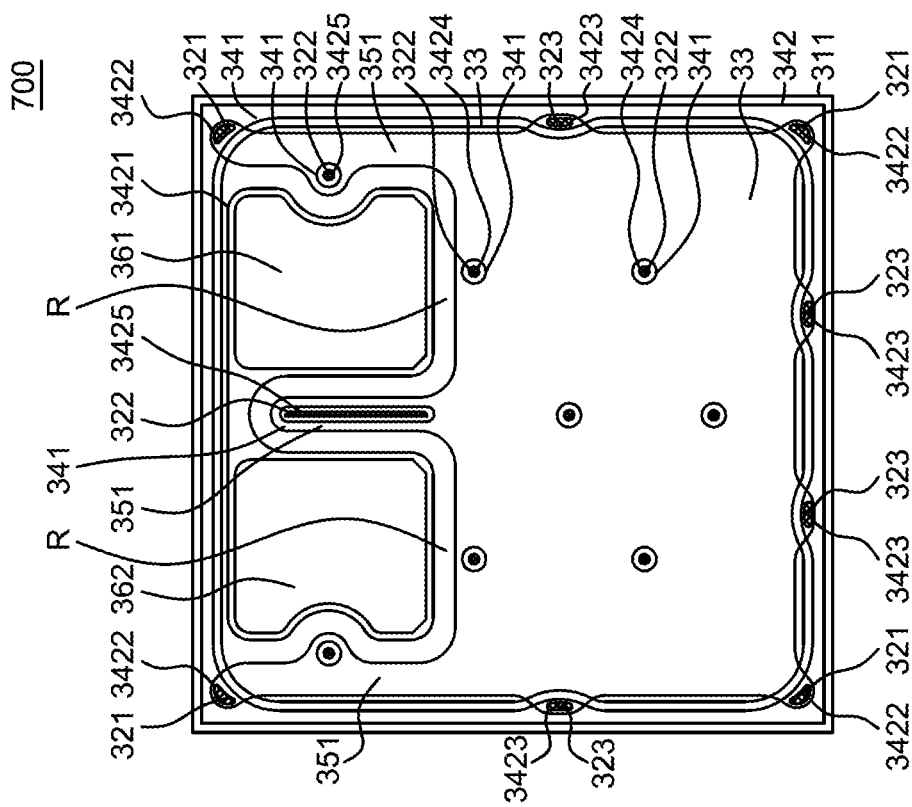

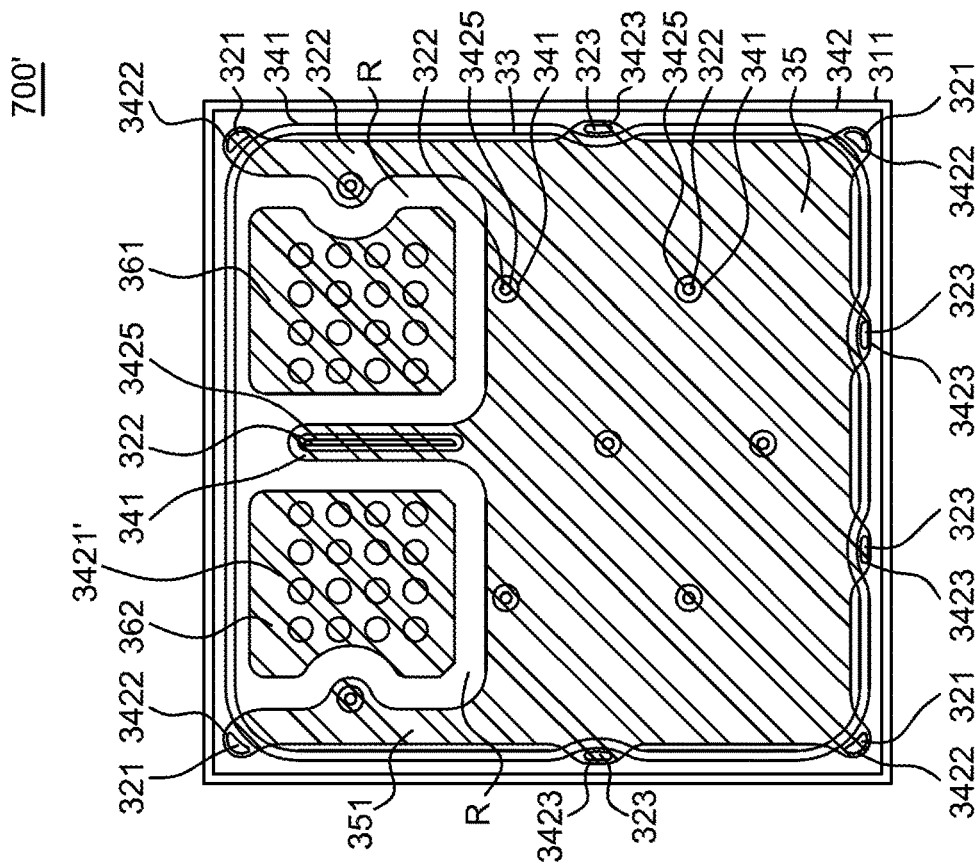
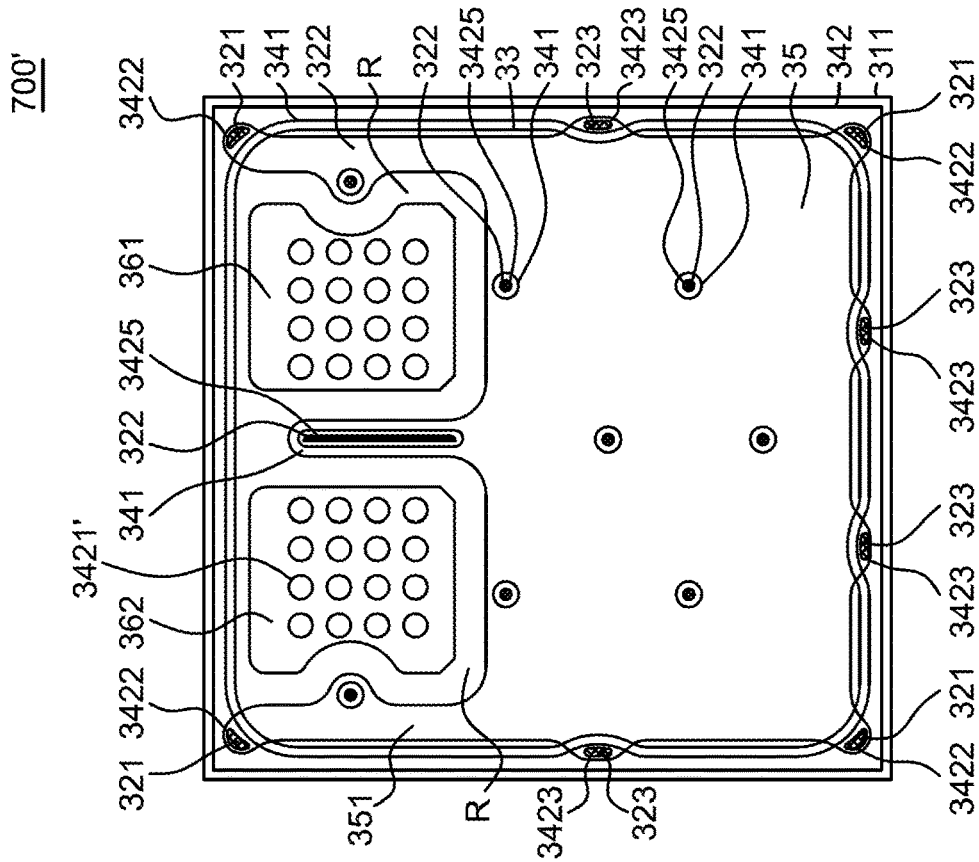

US 11,011,679 B2

OPTOELECTRONIC DEVICE AND METHOD FOR MANUFACTURING THE SAME

REFERENCE TO RELATED APPLICATION

This present application is a continuation application of U.S. patent application Ser. No. 15/820,002, filed on Nov. 21, 2017, now pending, which is a continuation application of U.S. patent application Ser. No. 14/791,949, filed on Jul. 6, 2015, now U.S. Pat. No. 9,859,467, claiming the right of priority based on TW application Serial No. 103123102, filed on Jul. 3, 2014, and the content of which is hereby incorporated by reference in its entirety.

TECHNICAL FIELD

The disclosure is related to an optoelectronic device, and more particularly, an optoelectronic device with electrode pattern design.

DESCRIPTION OF THE RELATED ART

The lighting theory of light-emitting diodes (LEDs) is to transform electrical energy to optical energy by applying electrical current to the LED and injecting electrons and holes to the active layer, where the electrons and holes recombine to emit light. Due to the difference of lighting theories between LEDs and incandescent lamps, the LED is called "cold light source". An LED has the advantages of large environment tolerance, a long service life, portability, and low power consumption and is regarded as another option for the lighting application. LEDs are regarded as new generation lighting tools and widely adopted in different fields, for example, traffic lights, backlight modules, street lights, and medical devices and replace conventional light sources gradually.

FIG. 1 shows a schematic structure of a conventional light emitting device. As shown in FIG. 1, the conventional light emitting device 100 includes a transparent substrate 10, a semiconductor stack 12 on the transparent substrate 10, and one electrode 14 on the abovementioned semiconductor stack 12 wherein the semiconductor stack 12 includes a first conductive type semiconductor layer 120, an active layer 122, and a second conductive type semiconductor layer 124 disposed from the top to the bottom.

Additionally, the abovementioned light emitting device 100 can combine and connect with other device to form a light emitting apparatus. As shown in FIG. 2, a light emitting apparatus 200 includes a sub-mount 20 having one circuit 202, a solder 22 on the sub-mount 20 for mounting the light emitting device 100 on the sub-mount 20 and electrically connecting the light emitting device 100 of the transparent substrate 10 with the circuit 202 of the sub-mount 20, and an electrical connecting structure 24 for electrically connecting with an electrode 14 of the light emitting device 100 and the circuit 202 of the sub-mount 20. The abovementioned sub-mount 20 can be a lead frame or mounting substrate with a large size and is beneficial to a circuit layout of the light emitting apparatus 200 and heat dissipation of the light emitting apparatus 200.

SUMMARY OF THE DISCLOSURE

An optoelectronic device comprises a first semiconductor layer comprising four boundaries, a corner formed by two of the neighboring boundaries, a first surface, and a second surface opposite to the first surface; a second semiconductor layer formed on the first surface of the first semiconductor layer; a second conductive type electrode formed on the second semiconductor layer; and two first conductive type electrodes formed on the first surface, wherein the first conductive type electrodes are separated and formed a pattern.

An optoelectronic device comprises a first semiconductor layer comprising multiple boundaries; a second semiconductor layer formed on the first semiconductor layer; an active layer formed between the first semiconductor layer and the second semiconductor layer; an insulating layer covering the second semiconductor layer, comprising a plurality of openings formed on one of the multiple boundaries; and a third electrode formed on the plurality of openings of the insulating layer to electrically connect the first semiconductor layer.

BRIEF DESCRIPTION OF THE DRAWING

The accompanying drawing is included to provide easy understanding of the present application, and is incorporated herein and constitutes a part of this specification. The drawing illustrates the embodiment of the present application and, together with the description, serves to illustrate the principles of the present application.

FIG. 3C, FIG. 3G and FIG. 3H show top views of an optoelectronic device in accordance with another embodiment of the present application.

FIG. 4A to FIG. 4L show top views of an optoelectronic device in accordance with another embodiments of the present application.

DETAILED DESCRIPTION OF THE EMBODIMENTS

To better and concisely explain the present application, please refer to the following description in accordance with FIG. 3A to FIG. 7A.

Figure 1:
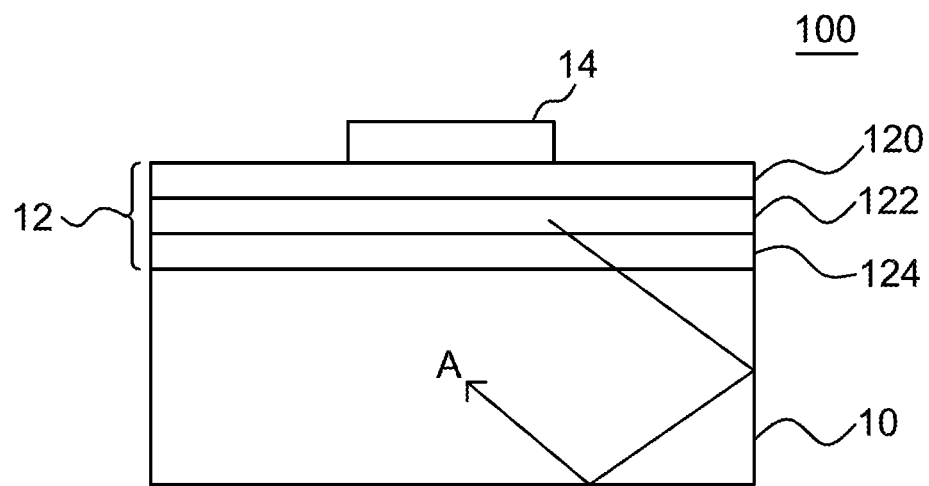
FIG. 1 shows a side view of a conventional optoelectronic device.
Figure 2:
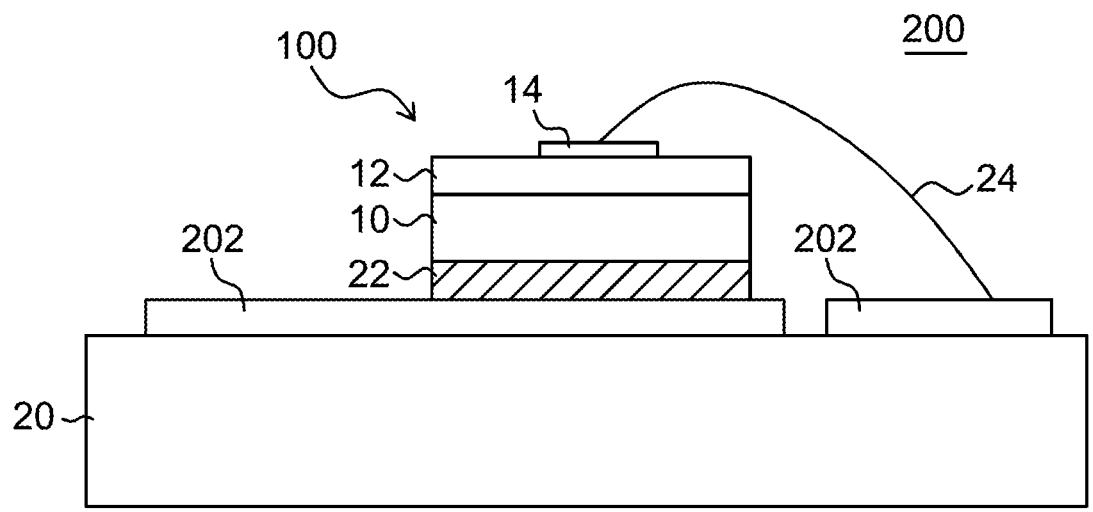
FIG. 2 shows a schematic view of a convention light emitting apparatus.
Figure 3A:
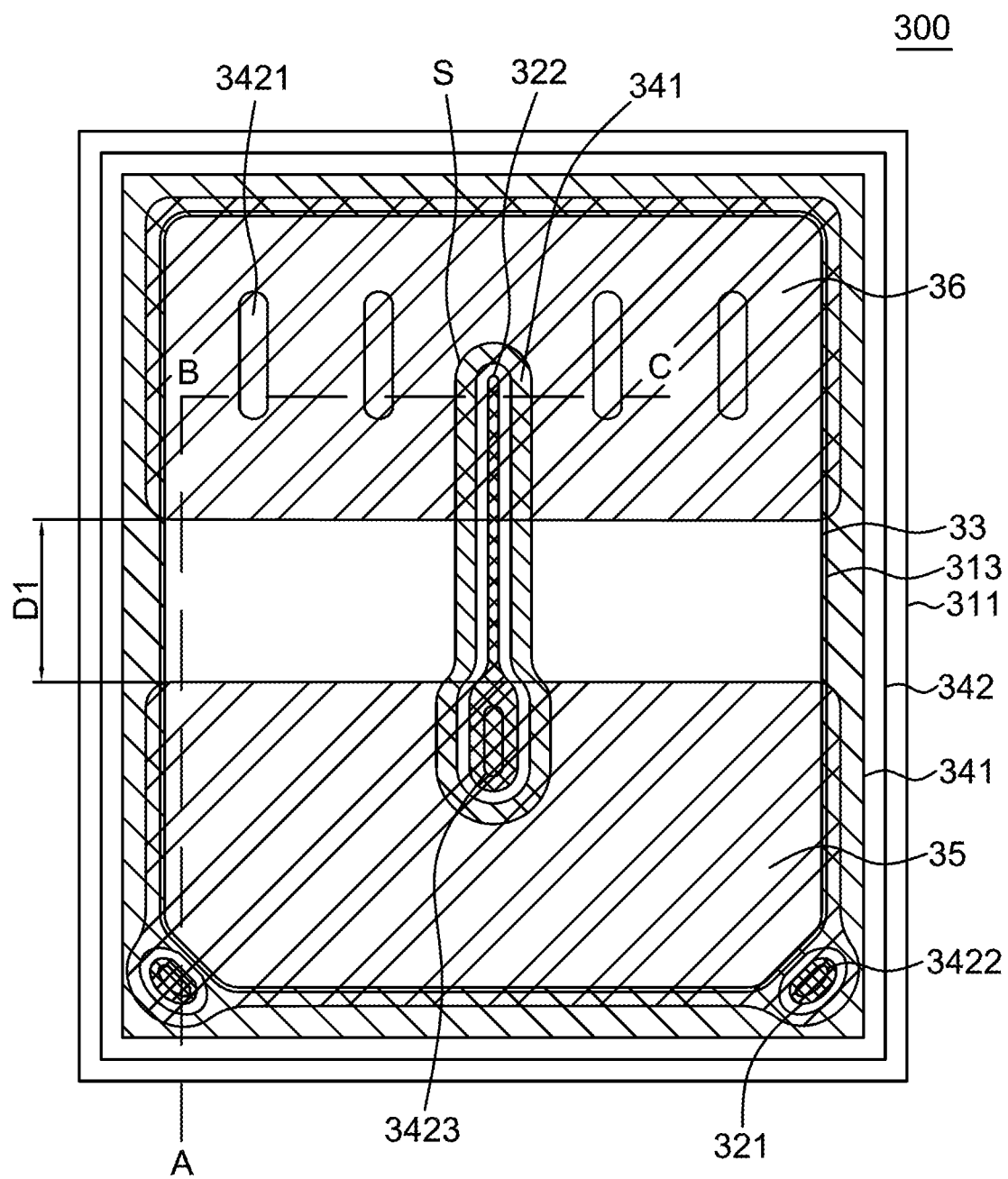
FIG. 3A, FIG. 3D, FIG. 3E and FIG. 3F show top views of an optoelectronic device in accordance with one embodiment of the present application.
Figure 3B:
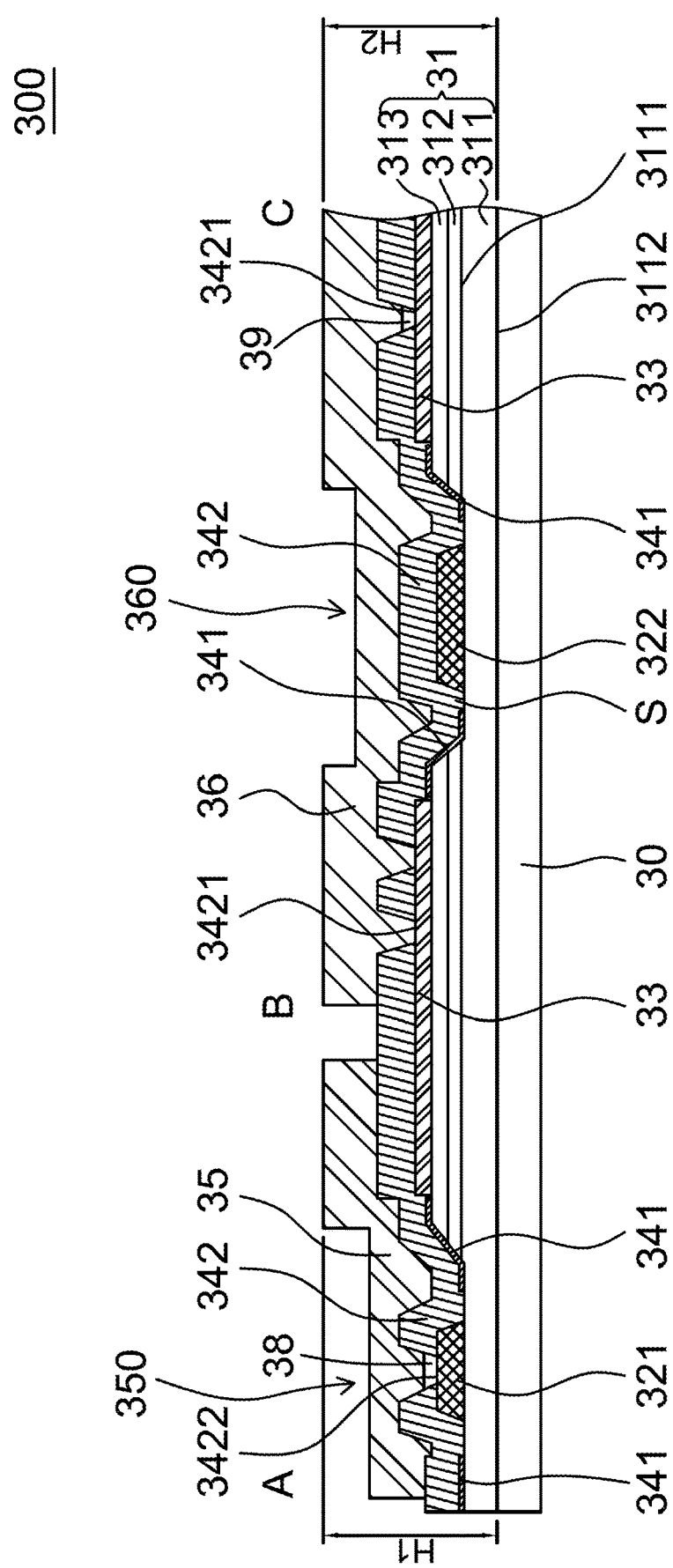
FIG. 3B shows a side view of an optoelectronic device in accordance with one embodiment of the present application.

FIG. 3A and FIG. 3B show a top view and a side view of an optoelectronic device 300 in accordance with the first embodiment of the present application. FIG. 3B shows a side view of FIG. 3A along the direction of A-B-C. The optoelectronic device 300 includes a substrate 30. The substrate 30 is not limited to a single material, but can be a composite substrate made of multiple different materials. For example, the substrate 30 can include a first substrate and a second substrate jointed with each other (not shown in the figures).

In a conventional epitaxial growth process, an epitaxial stack 31 is formed on a substrate 30 and includes a first semiconductor layer 311 having a first surface 3111 and a second surface 3112 opposite to the first surface 3111, an active layer 312 formed on the first surface 3111 of the first semiconductor layer 3112, and a second semiconductor layer 313 formed on the active layer 312. Next, a portion of the epitaxial stack is selectively removed by photolithography so that a portion of the first semiconductor layer 311 on a boundary of the optoelectronic device 300 is exposed to form a groove S in the optoelectronic device 300. In one embodiment, the groove S exposes the portion of the first semiconductor layer 311 and is surrounded by the second semiconductor layer 313. In one embodiment, the top view of the groove S can be an elongated strip-shape.

Next, a first insulating layer 341 is formed on a surface of the epitaxial stack 31 of the optoelectronic device 300 and the abovementioned groove S by chemical vapor deposition (CVD) or physical vapor deposition (PVD). FIG. 3D further shows a top view of the first insulating layer 341 highlighted by oblique stripes in accordance with the optoelectronic device 300 shown in FIG. 3A.

Next, at least a first part of the first conductive type electrode 321 is formed on the exposed portion of the first semiconductor layer 311 on the boundary of the optoelectronic device 300. FIG. 3E further shows a top view of the first part of the first conductive type electrode 321, and the second part of the first conductive type electrode 322 highlighted by oblique stripes in accordance with the optoelectronic device 300 shown in FIG. 3A. In one embodiment, the first part of the first conductive type electrode 321 is not surrounded by the second semiconductor layer 313, and a second part of the first conductive type electrode 322 is formed on the abovementioned groove S. In present embodiment, the separated first part of the first conductive type electrode 321 and the second part of the first conductive type electrode 322 are formed as an electrode pattern design of the first conductive type electrode.

In one embodiment of present disclosure, the electrode pattern design can include different selections of quantity, shape, and location of electrodes for enhancing current spreading near the boundary of the optoelectronic device. For example, the electrode pattern design of the first conductive type electrodes can include one or multiple of the first part of the first conductive type electrode 321, and one or multiple of the second part of the first conductive type electrode 322, while the second part of the first conductive type electrode 322 is surrounded by the second semiconductor layer 313 in a top view and can be an extended shape.

In one embodiment, the first semiconductor layer 311 of the optoelectronic device 300 includes four boundaries while two neighboring boundaries form a corner, and there is no conductive structure crossing the boundaries. In present embodiment, two of the first part of the first conductive type electrode 321 of the optoelectronic device 300 are formed in two corners on the same side and are separated without crossing the boundaries of the optoelectronic device 300.

In one embodiment, the projection of the first part of the first conductive type electrode 321 on the first semiconductor layer 311 can have a shape. The shape can be a polygon, a circle, an oval, a semi-circle, or a cambered surface. The shape of the second part of the first conductive type electrode 322 can be a line, a curve, or a combination of line and curve, or can have a branch. In one embodiment, the second part of the first conductive type electrode 322 can have a head portion and a tail portion; the head portion have a width larger than that of the tail portion.

Next, a second conductive type electrode 33 is formed on the second semiconductor layer 313. In one embodiment, the ratio of a projected area of the second conductive type electrode 33 on the first semiconductor layer 311 and an upper surface area of the second semiconductor layer 313 can be between 90~100%.

After that, a second insulating layer 342 is formed on the first part of the first conductive type electrode 321, the second part of the first conductive type electrode 322, the second conductive type electrode 33, and a portion of the first insulating layer 341. Herein the second insulating layer 342 can have a first opening 3421 for electrically connecting the second conductive type electrode 33 with a fourth electrode 36 formed in the follow-up process. In one embodiment, the first insulating layer 341 or the second insulating layer 342 can completely cover the exposed portion of the first semiconductor layer 311.

In one embodiment, the first insulating layer 341 or the second insulating layer 342 can be a transparent insulating layer. The material of the first insulating layer 341 or the second insulating layer 342 can be oxide, nitride, or polymer, and the oxide can include $Al_2O_3$, $SiO_2$, $TiO_2$, tantalum pentoxide ($Ta_2O_5$) or $AlO_x$; the nitride can include AlN and SiNx; the polymer can include polyimide, benzocyclobutane (BCB) or a combination thereof. In one embodiment, the first insulating layer 341 or the second insulating layer 342 can be a Distributed Bragg Reflector (DBR) structure.

Finally, a third electrode 35 is formed on the second insulating layer 342, the first part of the first conductive type electrode 321, and the second part of the first conductive type electrode 322, and electrically connects with the first part of the first conductive type electrode 321 and the second part of the first conductive type electrode 322. From a cross-sectional view, the third electrode 35 comprises a concave portion 350 corresponding to one of the first conductive type electrodes 321. The fourth electrode 36 is formed on the second insulating layer 342 and the second conductive type electrode 33, and electrically connects with the second insulating layer 342 and the second conductive type electrode 33. From a cross-sectional view, the fourth electrode 36 comprises a concave portion 360 corresponding to one of the first conductive type electrodes 322. FIG. 3F shows a top view of the third electrode 35 and the fourth electrode 36 highlighted by oblique stripes in accordance with the optoelectronic device 300 shown in FIG. 3A. In one embodiment, in a top view, the ratio of the projected area of the third electrode 35 on the first semiconductor layer 311 and the fourth electrode 36 on the first semiconductor layer 311 is 80~100%.

In one embodiment, the third electrode 35 can cover a portion of the first part of the first conductive type electrode 321. In another embodiment, the third electrode 35 can be formed without even covering the first part of the first conductive type electrode 321.

In one embodiment, an upper boundary of the third electrode 35 to an upper boundary of the substrate 30 has a height H1, an upper boundary of the fourth electrode 36 to an upper boundary of the substrate 30 has a height H2, and the height H1 is substantially the same as the height H2. In one embodiment, a difference between the height H1 and the height H2 is less than 5~10%. By adjusting the difference between the height H1 and the height H2, the probability of line breakage is reduced when the optoelectronic device 300 forms a flip-chip structure with the sub-mount or the electrical circuit element, and thus a yield rate of the products can be enhanced. In one embodiment, the boundary of third electrode 35 to the boundary of the fourth electrode 36 has a distance D1, and the distance D1 is larger than 50 μm. In one embodiment, the distance D1 can be in a range of 50-200 μm or 100-200 μm.

In one embodiment, the first part of the first conductive type electrode 321, the second one of first conductive type electrode 322, the second conductive type electrode 33, the third electrode 35 and the fourth electrode 36 can be a multi-layer structure and/or include a reflective layer (not shown) having reflectivity of more than 80% to the light emitted from the active layer 312. In one embodiment, the first part of the first conductive type electrode 321, the second part of first conductive type electrode 322, and the third electrode 35 can be formed in the same process. In one embodiment, a light emitted from the optoelectronic device 300 can be reflected by the first part of the first conductive type electrode 321, the second part of first conductive type electrode 322, the second conductive type electrode 33, the third electrode 35 and the fourth electrode 36, and leave the optoelectronic device 300 from the direction of the substrate 30.

To achieve certain level of conductivity, a material of the first part of the first conductive type electrode 321, the second part of the first conductive type electrode 322, the second conductive type electrode 33, the third electrode 35 and the fourth electrode 36 can be metal, for example, Au, Ag, Cu, Cr, Al, Pt, Ni, TI, Sn, an alloy thereof or a stack combination thereof.

In one embodiment, the sub-mount or the electrical circuit element (not shown) is provided and a first sub-mount electrode (not shown) and a second sub-mount electrode (not shown) are formed on the sub-mount or the electrical circuit element by wire bonding and soldering tin. The first sub-mount electrode and the second sub-mount electrode can form a flip-chip structure with the third electrode 35 and the fourth electrode 36 of the optoelectronic device 300.

In one embodiment, an first adjustment layer 38 is formed between the first part of the first conductive type electrode 321, and/or the second part of the first conductive type electrode 322, and the third electrode 35, and is electrically connected with the first part of the first conductive type electrode 321, and/or the second part of the first conductive type electrode 322, and the third electrode 35. In one embodiment, a second adjustment layer 39 is formed between the second conductive type electrode 33 and the fourth electrode 36, and is electrically connected with the second conductive type electrode 33 and the fourth electrode 36. In one embodiment, a height is formed between the first adjustment layer 38 and the second adjustment layer 39. Because the locations of the first adjustment layer 38 and the second adjustment layer 39 make the first adjustment layer 38 and the second adjustment layer 39 affect the heights H1 and H2. By separately designing the height of the first adjustment layer 38 and the second adjustment layer 39, the difference between the heights H1 and H2 can be reduced so as to reduce the probability of line breakage when the optoelectronic device 300 forms a flip-chip structure with the sub-mount or the electrical circuit element, and the yield rate of the products can be enhanced. In one embodiment, a projected area of the first adjustment layer 38 on the first semiconductor layer 311 is larger than that of the third electrode 35 on the first semiconductor layer 311, or a projected area of the second adjustment layer 39 on the first semiconductor layer 311 is larger than that of the fourth electrode 36 on the first semiconductor layer 311. In one embodiment, the first adjustment layer 38 or the second adjustment layer 39 can be metal, for example, Au, Ag, Cu, Cr, Al, Pt, Ni, TI, Sn, an alloy thereof or a stack combination thereof. In one embodiment, the first adjustment layer 38 or the second adjustment layer 39 can have a multi-layer structure, and/or can include a reflective layer (not shown) having reflectivity of more than 80% to the light emitted from the active layer 312.

Figure 3C:
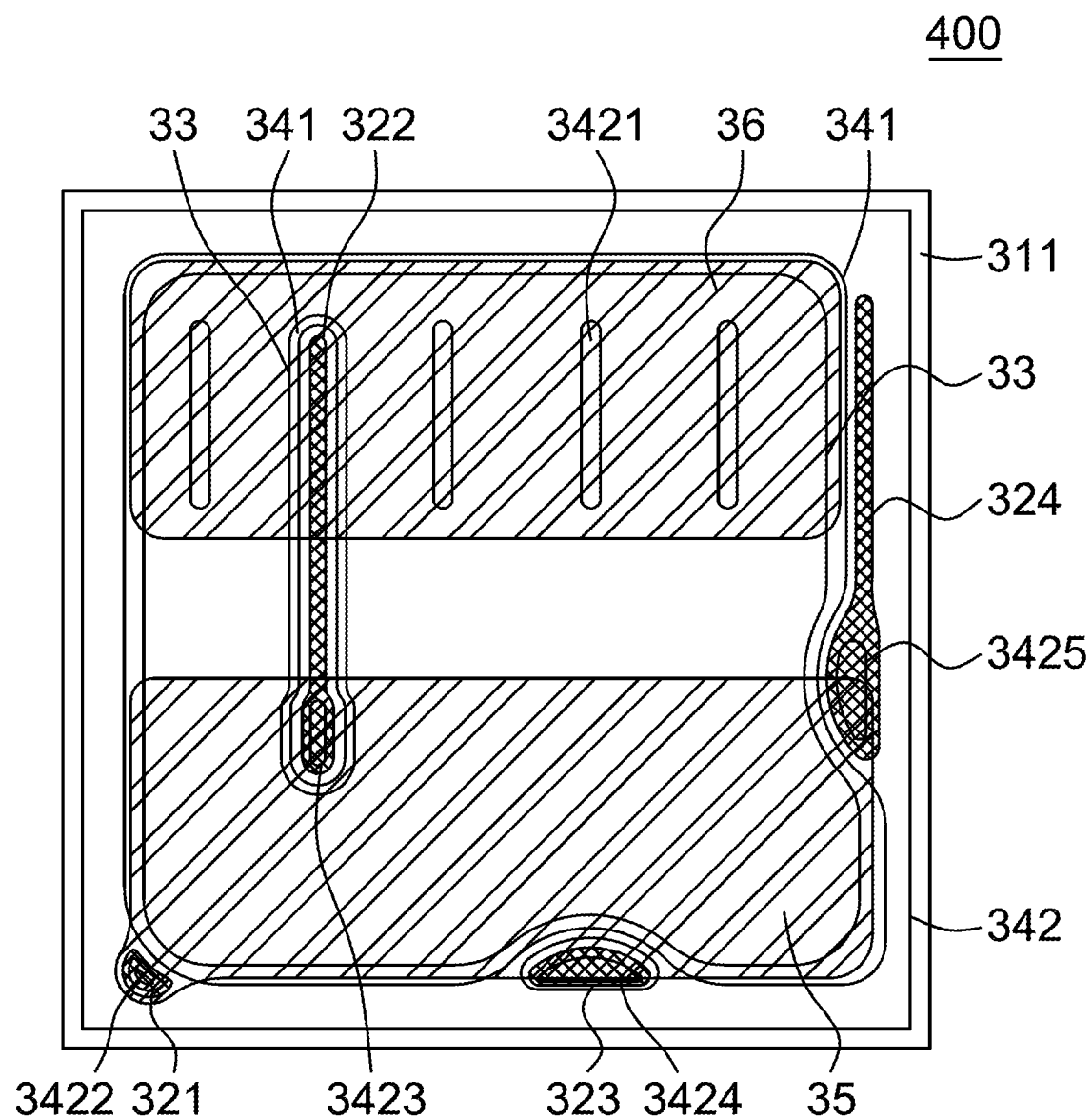
Figure 3D:
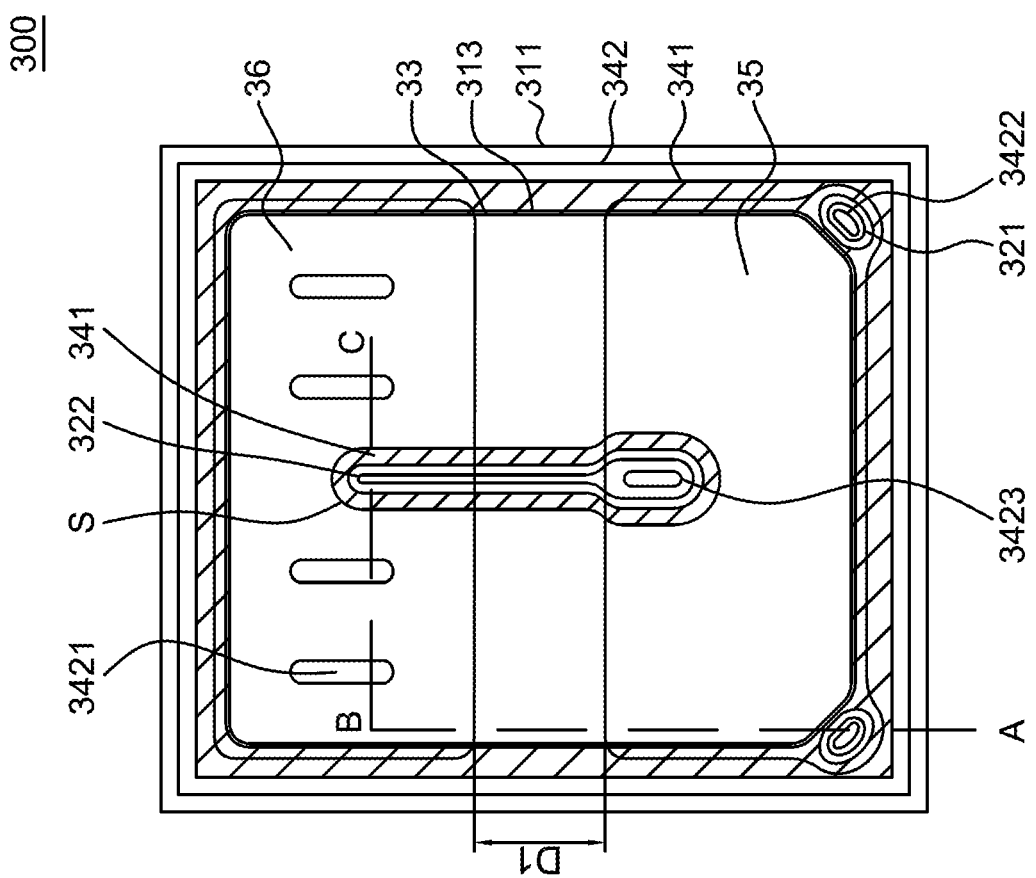
Figure 3F:
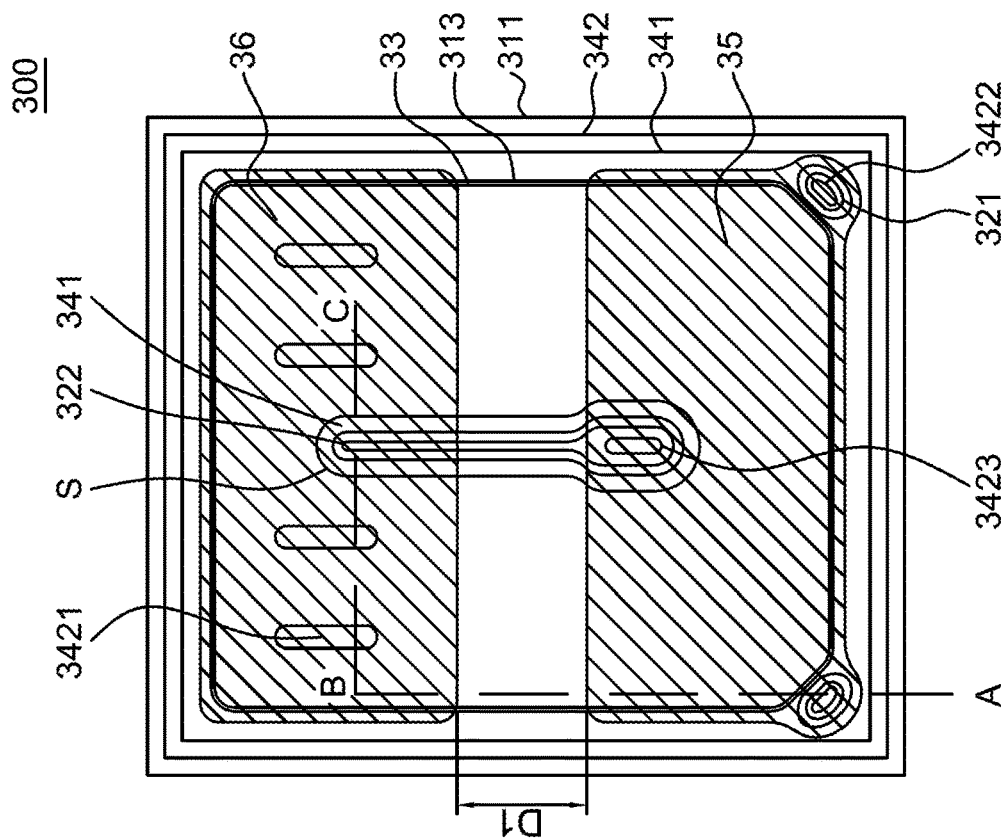
Figure 3E:
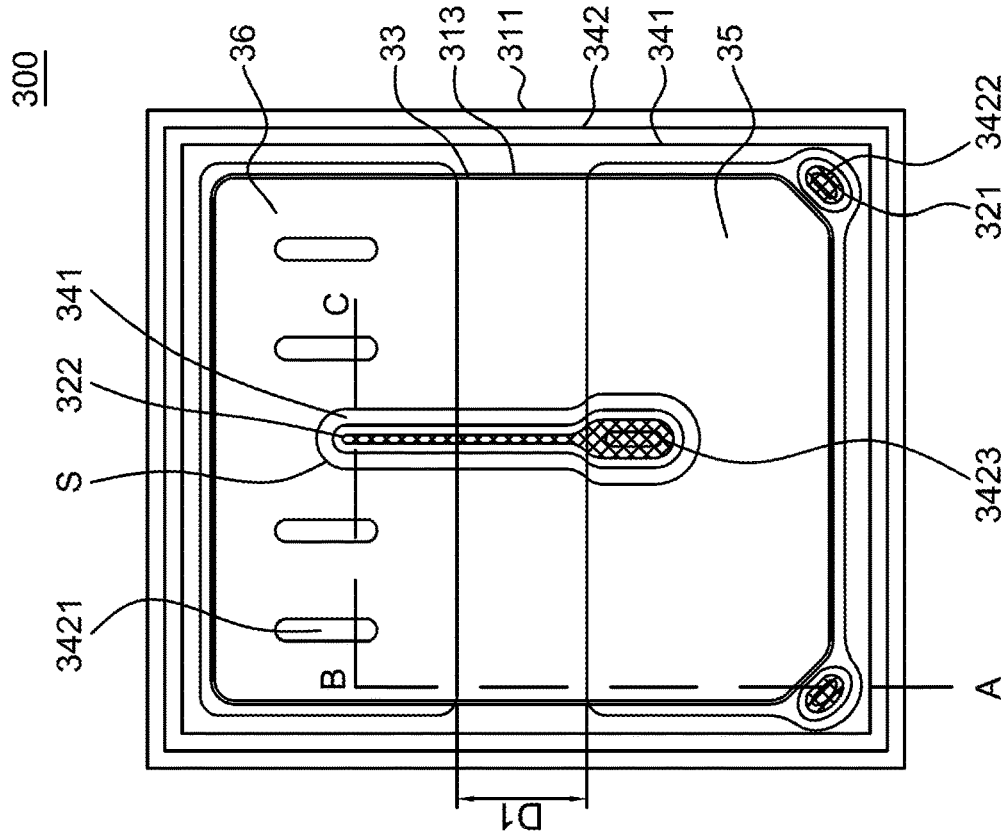

FIG. 3C shows a top view of an optoelectronic device 400 disclosed a second embodiment of the present disclosure. The manufacturing method, the materials, and the labels of the present embodiment are the same as that of the first embodiment, and those are omitted herein. In one embodiment of present disclosure, the electrode pattern design can include different selections of quantity, shape, and location of electrodes for enhancing current spreading near the boundary of the optoelectronic device 400.

In one embodiment, the first semiconductor layer 311 of the optoelectronic device 400 includes four boundaries while two neighboring boundaries form a corner, and there is no conductive structure crossing the boundaries. In present embodiment, the first part of the first conductive type electrode 321 is formed in any corner of the first semiconductor layer 311, and the second insulating layer 342 has an second opening 3422 for electrically connecting the first part of the first conductive type electrode 321 with the third electrode 35 formed later. The second part of the first conductive type electrode 322 is formed on the first semiconductor layer 311 and is surrounded by the second semiconductor layer 313, and the second insulating layer 342 can also have a third opening 3423 for electrically connecting the second part of the first conductive type electrode 322 with the third electrode 35 formed later.

In one embodiment, the projection of the first part of the first conductive type electrode 321 on the first semiconductor layer 311 can have a shape. The shape can be a polygon, a circle, an oval, a semi-circle, or a cambered surface. The shape of the second part of the first conductive type electrode 322 can be a line, a curve, or a combination of line and curve, or can have a branch. In one embodiment, the second part of the first conductive type electrode 322 can have a head portion and a tail portion, and the head portion have a width larger than that of the tail portion.

In present embodiment, a third part of the first conductive type electrode 323 is formed on an exposed portion of the first semiconductor layer 311 near the boundary of the optoelectronic device 400. In one embodiment, the third part of the first conductive type electrode 323 is not surrounded by the second semiconductor layer 313, and the second insulating layer 342 can have a fourth opening 3424 for electrically connecting the third part of the first conductive type electrode 323 with the third electrode 35 formed later. A fourth part of the first conductive type electrode 324 is formed on the exposed portion of the first semiconductor layer 311 near the boundary of the optoelectronic device 400. In one embodiment, the fourth part of the first conductive type electrode 324 is not surrounded by the second semiconductor layer 313, and the second insulating layer 342 can have a fifth opening 3425 for electrically connecting the fourth part of the first conductive type electrode 324 with the third electrode 35 formed later. FIG. 3G further shows a top view of the first part of the first conductive type electrode 321, the second part of the first conductive type electrode 322, the third part of the first conductive type electrode 323 and the fourth part of the first conductive type electrode 324 highlighted by oblique stripes in accordance with the optoelectronic device 400 shown in FIG. 3C.

In one embodiment, the projection of the third part of the first conductive type electrode 323 on the first semiconductor layer 311 can have a shape. The shape can be a polygon, a circle, an oval, a semi-circle, or a cambered surface. The shape of the fourth part of the first conductive type electrode 324 can be a line, a curve, or a combination of line and curve, or can have a branch. In one embodiment, the second part of the first conductive type electrode 322 can have a head portion and a tail portion, and the head portion have a width larger than that of the tail portion. In one embodiment, the shape of the third part of the first conductive type electrode 323 is different from that of the fourth part of the first conductive type electrode 324.

In one embodiment, according to the requirement of product design, the first part of the first conductive type electrode 321 and the third part of the first conductive type electrode 323 can be formed near the same boundary of the optoelectronic device 400 and separated with each other. In one embodiment, the first part of the first conductive type electrode 321 and the fourth part of the first conductive type electrode 324, or the third part of the first conductive type electrode 323 and the fourth part of the first conductive type electrode 324 is not formed near the same boundary of the optoelectronic device 400.

In one embodiment, a head portion of the fourth part of the first conductive type electrode 324 can be covered by the third electrode 35 and a tail portion of the fourth part of the first conductive type electrode 324 is not covered by the fourth electrode 36. In one embodiment, a projected area of the third electrode 35 on the first semiconductor layer 311 is larger than that of the fourth electrode 36 on the first semiconductor layer 311, and a ratio of the projected area of the third electrode 35 on the first semiconductor layer 311 and that of the fourth electrode 36 on the first semiconductor layer 311 is between 110~120%. In one embodiment, an extended direction of the tail portion of the second part of the first conductive type electrode 322 and that of the tail portion of the fourth part of the first conductive type electrode 324 are substantially parallel with each other. FIG. 3H further shows a top view of the third electrode 35 and the fourth electrode 36 highlighted by oblique stripes in accordance with the optoelectronic device 400 shown in FIG. 3C.

Figure 4A:
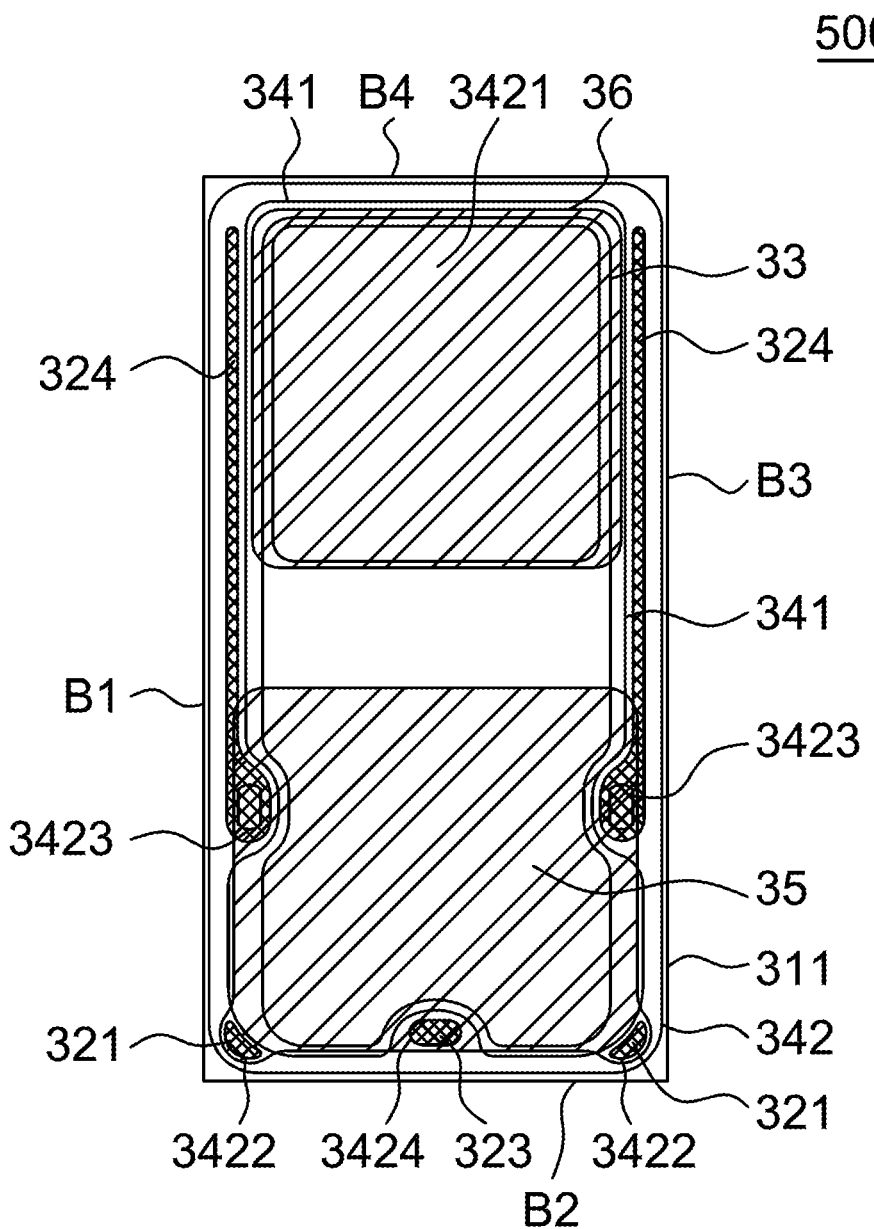

FIG. 4A shows a top view of an optoelectronic device 500 disclosed a third embodiment of the present disclosure. The manufacturing method, the materials, and the labels of the present embodiment are the same as that of the first embodiment, and those are omitted herein. In one embodiment of present disclosure, the electrode pattern design can include different selections of quantity, shape, and location of electrodes for enhancing current spreading near the boundary of the optoelectronic device 500.

In present embodiment, four boundaries of the optoelectronic device 500 form a rectangle while two neighboring boundaries form a corner and there is no conductive structure crossing the boundaries. The boundaries include a first long side B1, a second long side B3, a first short side B2, and a second short side B4. In one embodiment, a length of the first long side B1 or the second long side B3 is larger than that of the first short side B2 or the second short side B4. In one embodiment, the projections of the third electrode 35 and the fourth electrode 36 on the first semiconductor layer 311 are arranged along the first long side B1 or the second long side B3.

In present embodiment, two separated first parts of the first conductive type electrode 321 are formed on two corners of the first short side B2, and the second insulating layer 342 has an second opening 3422 for electrically connecting the first part of the first conductive type electrode 321 with the third electrode 35 formed later. Two separated fourth parts of the first conductive type electrode 324 are formed on exposed portion of the first semiconductor layer 311 of the long side B1 and the second long side B3 respectively. In present embodiment, the third part of the first conductive type electrode 323 is formed on the first short side B2, and the second insulating layer 342 can also have a fourth opening 3424 for electrically connecting the third part of the first conductive type electrode 323 with the third electrode 35 formed later. The fourth part of the first conductive type electrode 324 is not surrounded by the second semiconductor layer 313, and the second insulating layer 342 can have a third opening 3423 for electrically connecting the four part of the first conductive type electrode 324 with the third electrode 35 formed later. FIG. 4E further shows a top view of the first part of the first conductive type electrode 321, the third part of the first conductive type electrode 323 and the fourth part of the first conductive type electrode 324 highlighted by oblique stripes in accordance with the optoelectronic device 500 shown in FIG. 4A.

In one embodiment, distances between the third part of the first conductive type electrode 323 and each one of two separated first parts of the first conductive type electrode 321 are substantially the same. Furthermore, the first part of the first conductive type electrode 321, the fourth part of the first conductive type electrode 324, and the third electrode 35 can be made in the same process.

In present embodiment, the projection of the first part of the first conductive type electrode 321 on the first semiconductor layer 311 can have a shape. The shape can be a polygon, a circle, an oval, a semi-circle, or a cambered surface. The projection of the third part of the first conductive type electrode 323 on the first semiconductor layer 311 can have a shape. The shape can be a polygon, a circle, an oval, a semi-circle, or a cambered surface. The shape of the fourth part of the first conductive type electrode 324 can be a line, a curve, or a combination of line and curve, or can have a branch. In one embodiment, the fourth part of the first conductive type electrode 324 can have a head portion and a tail portion, and the head portion have a width larger than that of the tail portion. In one embodiment, the shape of the third part of the first conductive type electrode 323 is different from that of the fourth part of the first conductive type electrode 324.

In one embodiment, the head portion of the fourth part of the first conductive type electrode 324 points to the first short side B2 and the tail portion of that points to the second short side B4. In one embodiment, the head portion of the fourth part of the first conductive type electrode 324 can be covered by the third electrode 35 and a tail portion of the fourth part of the first conductive type electrode 324 is not covered by the fourth electrode 36. In one embodiment, the extended directions of two tail portion of fourth part of the first conductive type electrode 324 are substantially parallel. In one embodiment, the projected area of the third electrode 35 on the first semiconductor layer 311 is larger than that of the fourth electrode 36 on the first semiconductor layer 311, and a ratio of the projected area of the third electrode 35 on the first semiconductor layer 311 and that of the fourth electrode 36 on the first semiconductor layer 311 is between 110~120%. FIG. 4F further shows a top view of the third electrode 35 and the fourth electrode 36 highlighted by oblique stripes in accordance with the optoelectronic device 500 shown in FIG. 4A.

Figure 4B:
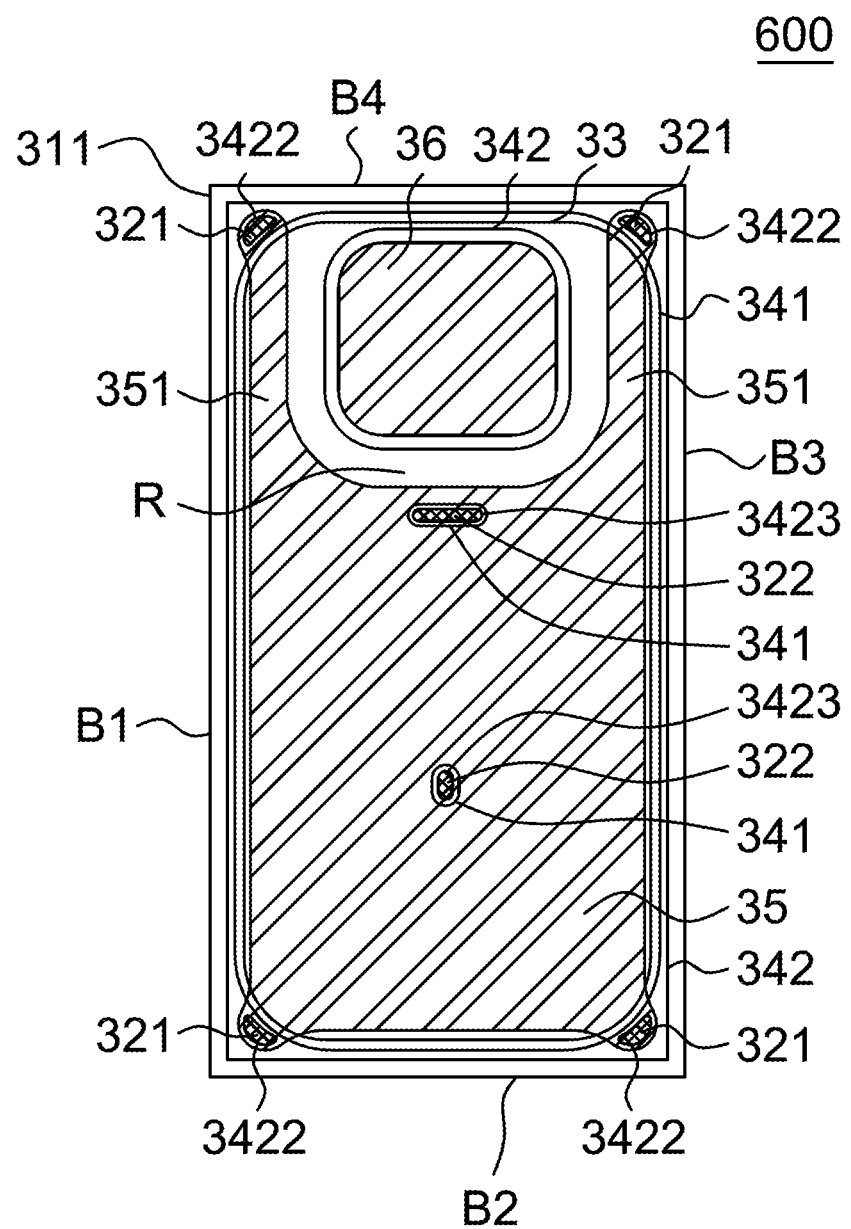

FIG. 4B shows a top view of an optoelectronic device 600 disclosed in a fourth embodiment of the present disclosure. The manufacturing method, the materials, and the labels of the present embodiment are the same as that of the first embodiment, and those are omitted herein. In one embodiment of present disclosure, the electrode pattern design can include different selections of quantity, shape, and location of electrodes for enhancing current spreading near the boundary of the optoelectronic device 600.

In present embodiment, four boundaries of the optoelectronic device 600 form a rectangle while two neighboring boundaries form a corner and there is no conductive structure crossing the boundaries. The optoelectronic device 600 includes a first long side B1, a second long side B3, a first short side B2, and a second short side B4. In one embodiment, a length of the first long side B1 or the second long side B3 is larger than that of the first short side B2 or the second short side B4. In one embodiment, the projections of the third electrode 35 and the fourth electrode 36 on the first semiconductor layer 311 are arranged along the first long side B1 or the second long side B3.

In present embodiment, the optoelectronic device 600 includes a first part of the first conductive type electrode 321. In one embodiment, four first parts of the first conductive type electrodes 321 are formed on four corners of the first semiconductor layer 311, and the second insulating layer 342 can also have a second opening 3422 for electrically connecting the first part of the first conductive type electrode 321 with the third electrode 35 formed later. Two second parts of the first conductive type electrodes 322 are formed on the first semiconductor layer 311 and surrounded by the second semiconductor layer 313, and the second insulating layer 342 can also have a third opening 3423 for electrically connecting the second part of the first conductive type electrode 322 with the third electrode 35 formed later.

In present embodiment, the projection of the first part of the first conductive type electrode 321 on the first semiconductor layer 311 can have a shape. The shape can be a polygon, a circle, an oval, a semi-circle, or a cambered surface. The projection of the second part of the first conductive type electrode 322 on the first semiconductor layer 311 can have a shape. The shape can be a polygon, a circle, an oval, a semi-circle, or a cambered surface. In one embodiment, the projected shape of each second part of the first conductive type electrode 322 can be the same or different. FIG. 4G further shows a top view of the first part of the first conductive type electrode 321 and the second part of the first conductive type electrode 322 highlighted by oblique stripes in accordance with the optoelectronic device 600 shown in FIG. 4B.

In present embodiment, the third electrode 35 includes two extended portions 351 forming a concave R, and the fourth electrode 36 is formed in the concave R. Furthermore, the first part of the first conductive type electrode 321, the second part of the first conductive type electrode 322, and the third electrode 35 can be formed in the same process. FIG. 4H further shows a top view of the third electrode 35 and the fourth electrode 36 highlighted by oblique stripes in accordance with the optoelectronic device 600 shown in FIG. 4B.

Figure 4C:
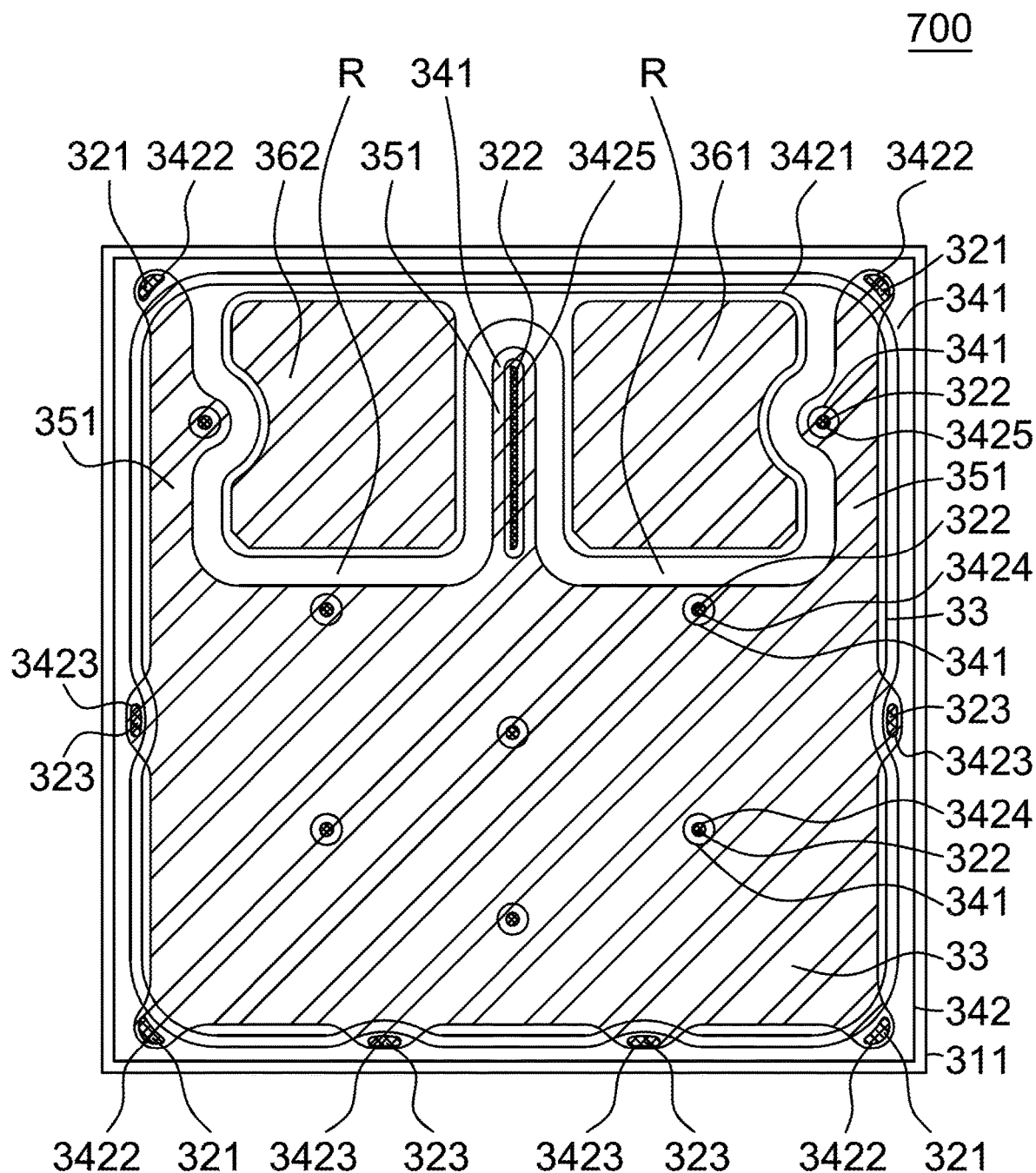

FIG. 4C shows a top view of an optoelectronic device 700 disclosed in a fifth embodiment of the present disclosure. The manufacturing method, the materials, and the labels of the present embodiment are the same as that of the first embodiment, and those are omitted herein. In one embodiment of present disclosure, the electrode pattern design can include different selections of quantity, shape, and location of electrodes for enhancing current spreading near the boundary of the optoelectronic device 700.

In one embodiment, the first semiconductor layer 311 of the optoelectronic device 700 includes four boundaries while two neighboring boundaries form a corner, and there is no conductive structure crossing the boundaries. In present embodiment, the optoelectronic device 700 includes four first parts of the first conductive type electrodes 321 formed in four corners of the first semiconductor layer 311, and the second insulating layer 342 has an second opening 3422 for electrically connecting the first part of the first conductive type electrode 321 with the third electrode 35 formed later. The plurality of second parts of the first conductive type electrode 322 is formed on the first semiconductor layer 311 and is surrounded by the second semiconductor layer 313, and the second insulating layer 342 also can have a fourth opening 3424 for electrically connecting the second part of the first conductive type electrode 322 with the third electrode 35 formed later. The plurality of third parts of the first conductive type electrode 323 is formed on the exposed portion of the first semiconductor layer 311 near the boundary of optoelectronic device 700. In other words, the third part of the first conductive type electrode 323 is not surrounded by the second semiconductor layer 313, and any one of the boundary of the first semiconductor layer 311 can include one or multiple third parts of the first conductive type electrodes 323. The second insulating layer 342 can also have a third opening 3423 for electrically connecting the second part of the first conductive type electrode 322 with the third electrode 35 formed later.

In present embodiment, the projection of the first part of the first conductive type electrode 321 on the first semiconductor layer 311 can have a shape. The shape can be a polygon, a circle, an oval, a semi-circle, or a cambered surface. The projection of the second part of the first conductive type electrode 322 on the first semiconductor layer 311 can have a shape. The shape can be a polygon, a circle, an oval, a semi-circle, or a cambered surface. In one embodiment, a shape of the second part of the first conductive type electrode 322 can be an extended shape, and the extended direction can be parallel to the extended portion 351. The shape of the second part of the first conductive type electrode 322 can be a line, a curve, or a combination of line and curve, or can have a branch. In one embodiment, the projected areas of the plurality of the second parts of the first conductive type electrode 322 can be the same or different. The projection of the third part of the first conductive type electrode 323 on the first semiconductor layer 311 can have a shape. The shape can be a polygon, a circle, an oval, a semi-circle, or a cambered surface. FIG. 4I further shows a top view of the first part of the first conductive type electrode 321, the second part of the first conductive type electrode 322 and the third part of the first conductive type electrode 323 highlighted by oblique stripes in accordance with the optoelectronic device 700 shown in FIG. 4C.

In present embodiment, the third electrode 35 includes three extended portions 351 forming two concaves R, and two fourth electrodes 361, 362 are formed in abovementioned two concaves R. In present embodiment, at least a second part of the first conductive type electrode 322 can be formed in the extended portions 351. FIG. 4J further shows a top view of the third electrode 35 and two fourth electrodes 361, 362 highlighted by oblique stripes in accordance with the optoelectronic device 700 shown in FIG. 4C.

In one embodiment, the projected shapes of the first part of the first conductive type electrode 321 and second part of the first conductive type electrode 322 on the first semiconductor layer 311 can be the same or different. Furthermore, the first part of the first conductive type electrode 321, the second part of the first conductive type electrode 322, the third part of the first conductive type electrode 323, and the third electrode 35 can be formed in the same process.

Figure 4D:
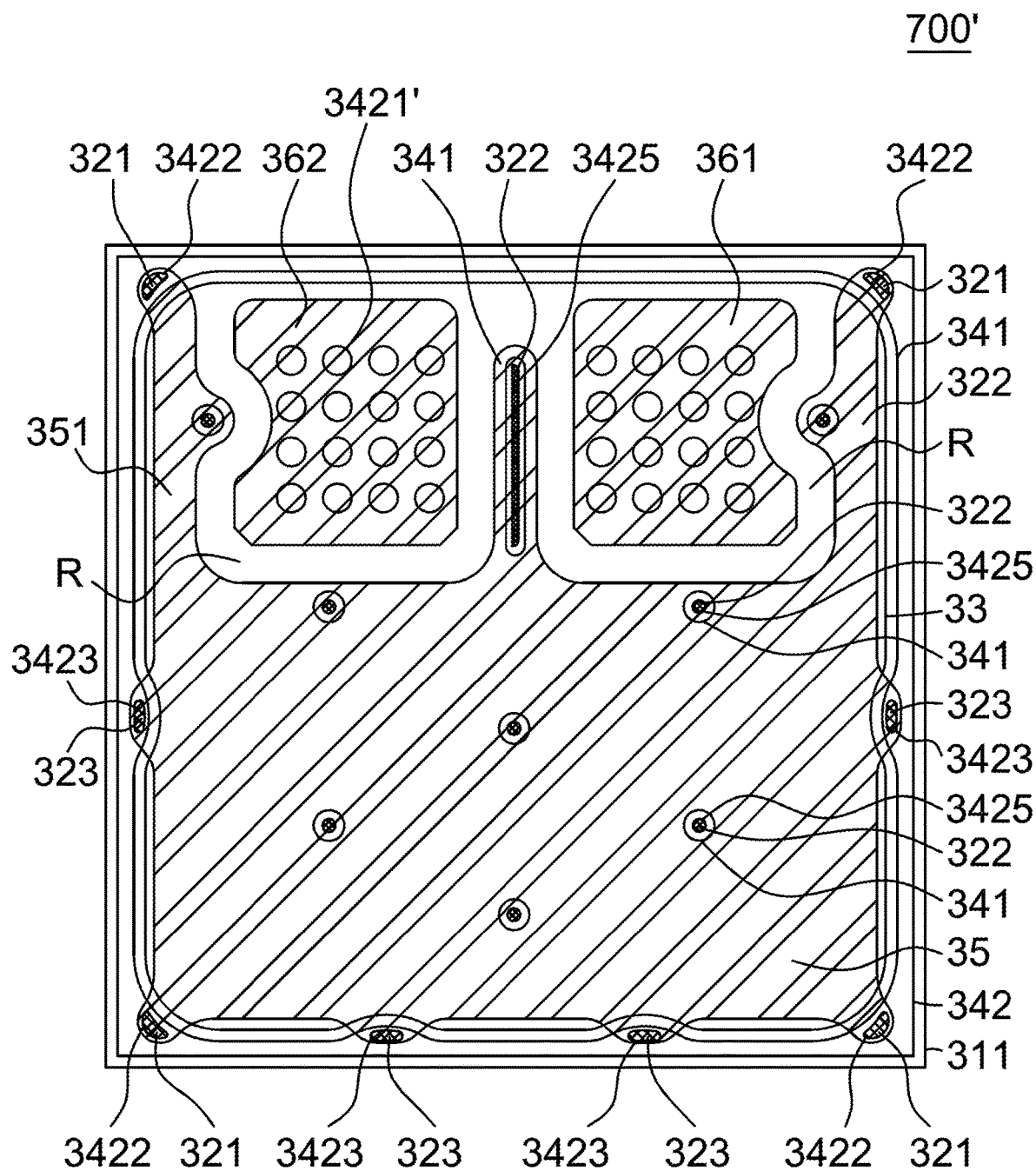
Figure 4F:
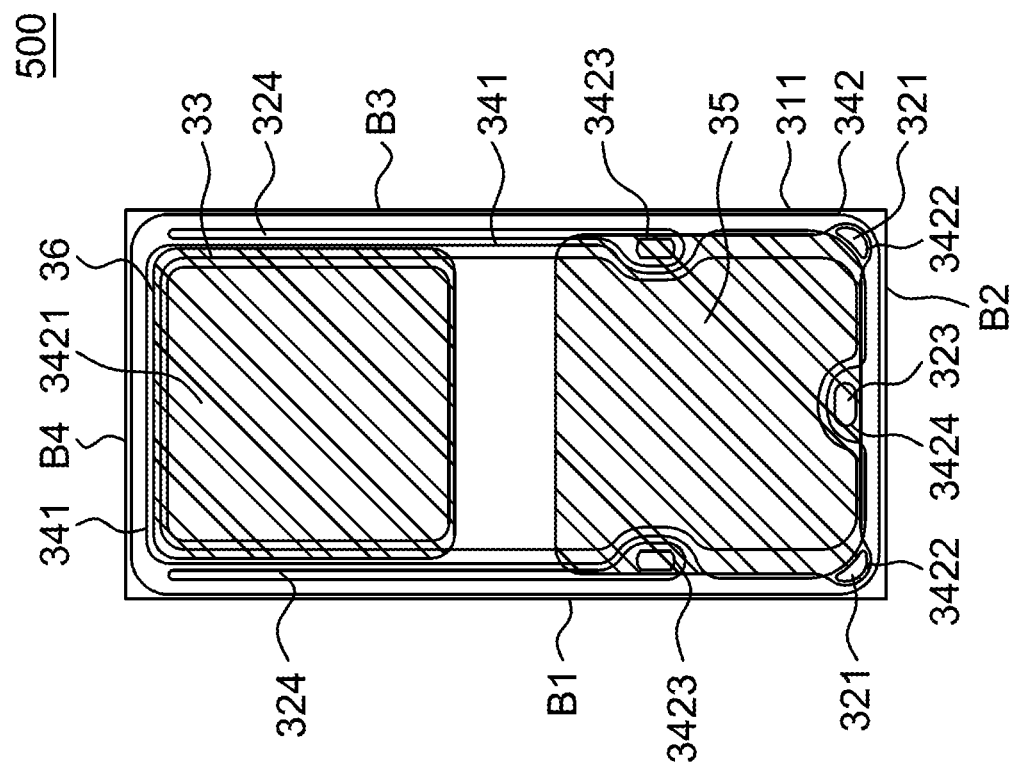
Figure 4E:
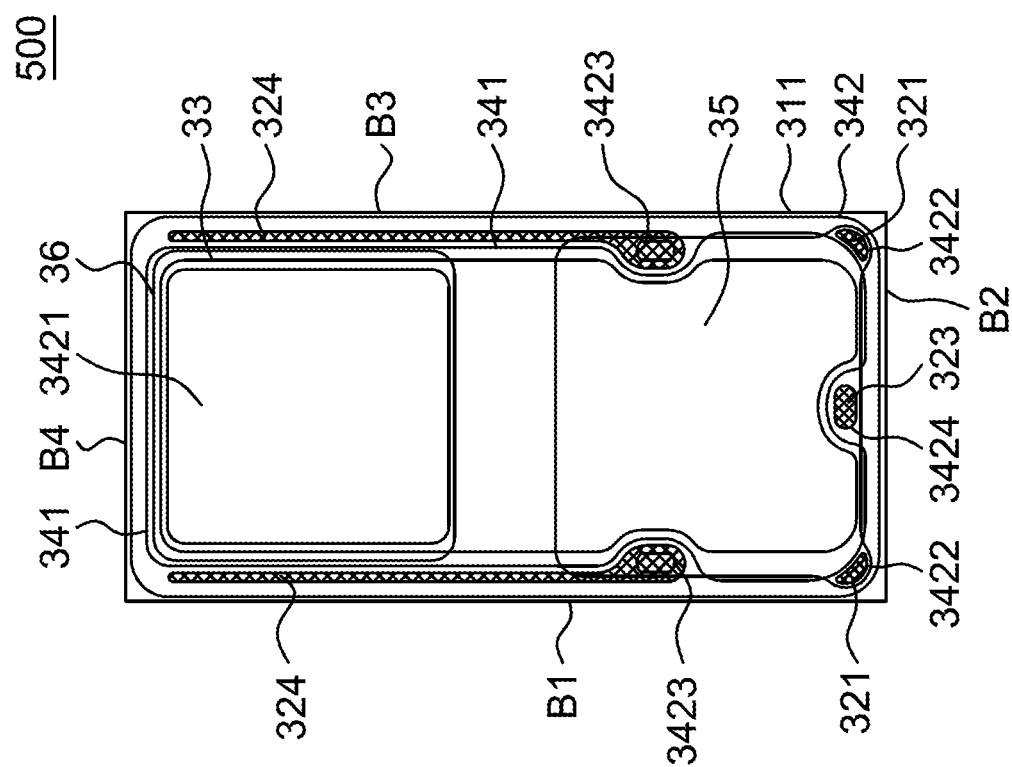
Figure 4H:
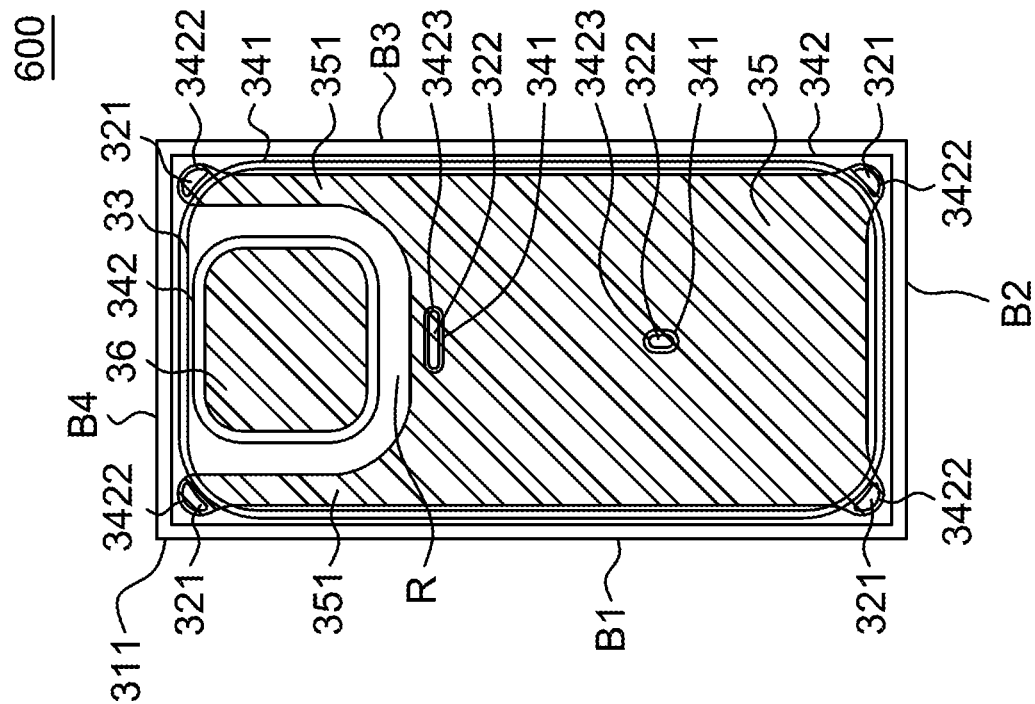
Figure 4G:
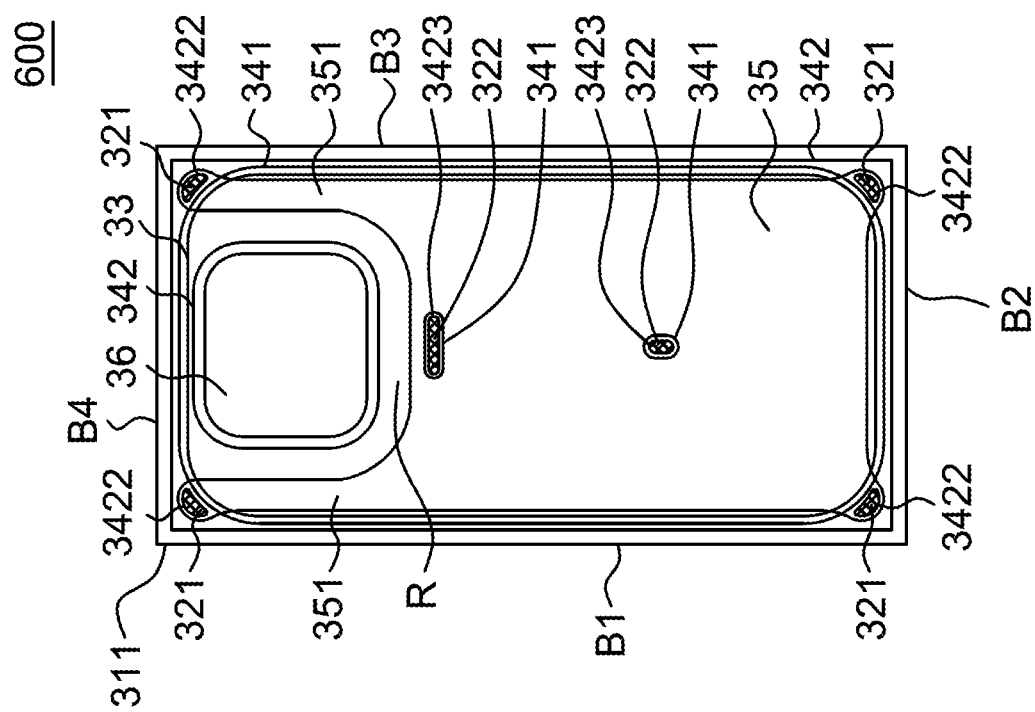

FIG. 4D shows a top view of an optoelectronic device 700' disclosed in a sixth embodiment of the present disclosure. The present embodiment is the possible variances of the fifth embodiment. The manufacturing method, the materials, and the labels of the present embodiment are the same as that of the fifth embodiment, and those are omitted herein.

In present embodiment, the second insulating layer 342 of the optoelectronic device 700' includes a plurality of first openings 3421' for electrically connecting the second part of the first conductive type electrode 33 and the fourth electrode 36 formed later. In present embodiment, the second insulating layer 342 have a plurality of the first openings 3421 for reducing the height difference between the third electrode 35 and the fourth electrode 36 so as to reduce the probability of line breakage when the optoelectronic device 700' forms a flip-chip structure with the sub-mount or the electrical circuit element, and the yield rate of the products can be enhanced. FIG. 4K further shows a top view of the first part of the first conductive type electrode 321, the second part of the first conductive type electrode 322 and the third part of the first conductive type electrode 323 highlighted by oblique stripes in accordance with the optoelectronic device 700' shown in FIG. 4D. FIG. 4L further shows a top view of the third electrode 35 and two fourth electrodes 361, 362 highlighted by oblique stripes in accordance with the optoelectronic device 700' shown in FIG. 4D.

Figure 5A:
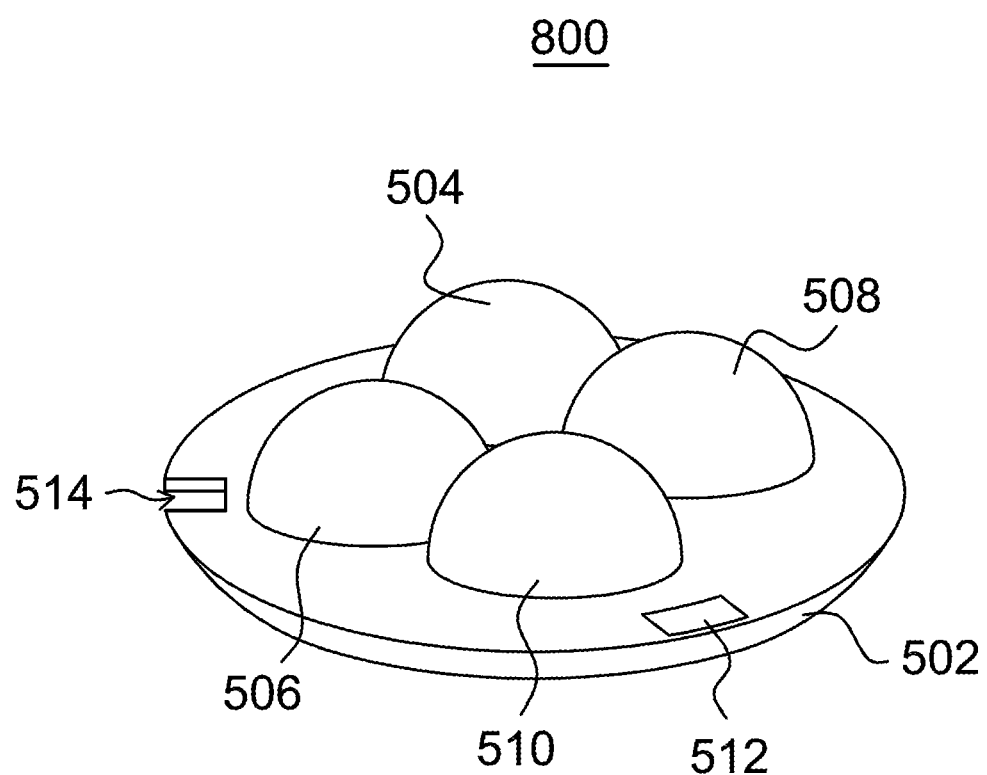
FIG. 5A through FIG. 5C show a light emitting module.
Figure 5B:
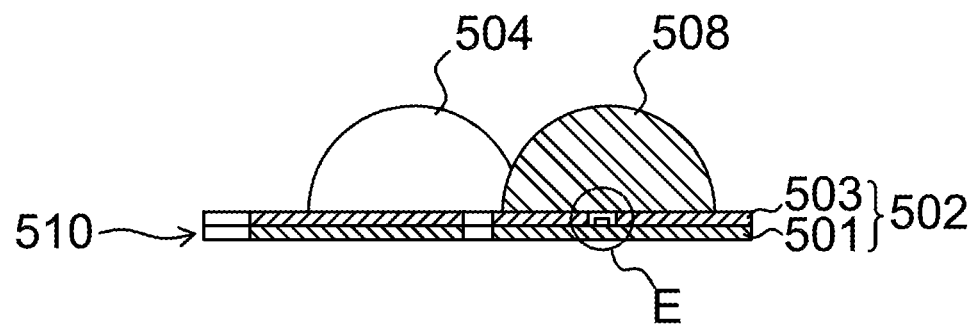
Figure 5C:
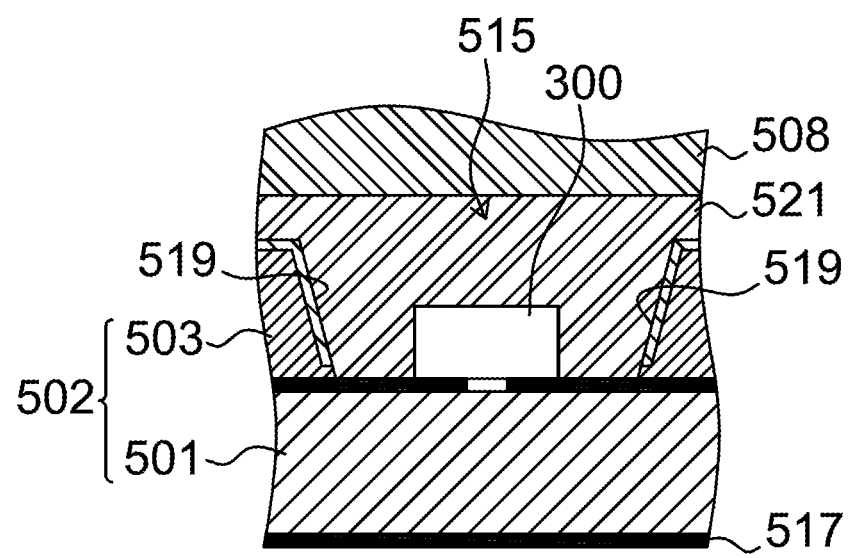

FIG. 5A through FIG. 5C show a light module. FIG. 5A shows an outer perspective view of the light emitting module. The light emitting module 800 can include a carrier 502, an optoelectronic device (not shown in the figures), a plurality of lenses 504, 506, 508, and 510, and two power supply terminations 512 and 514. The light emitting module 800 can be electrically connected with a light emitting unit 540 mentioned below.

FIG. 5B and FIG. 5C show a cross-sectional view of a light-emitting module 800 wherein FIG. 5C is a detailed view of the region E of FIG. 5B. The carrier 502 can include an upper carrier 503 and a lower carrier 501 wherein a surface of the lower carrier 501 contacts the upper carrier 503. The lenses 504 and 508 are formed on the upper carrier 503. The upper carrier 503 can form one through hole 515 and the optoelectronic device 300 disclosed in the embodiments or an optoelectronic device of other embodiments not shown in the figures can be formed in the through hole 515, contact the lower carrier 501, and be surrounded by a glue 521. The lens 508 is on the glue material 521, and a material of the glue 521 can be silicone resin, epoxy resin or other material. In one embodiment, a reflection layer 519 can be formed on side walls of the through hole 515 for increasing light efficiency; a metal layer 517 can be formed on a lower surface of the lower carrier 501 for increasing heat dissipation rate.

Figure 6A:
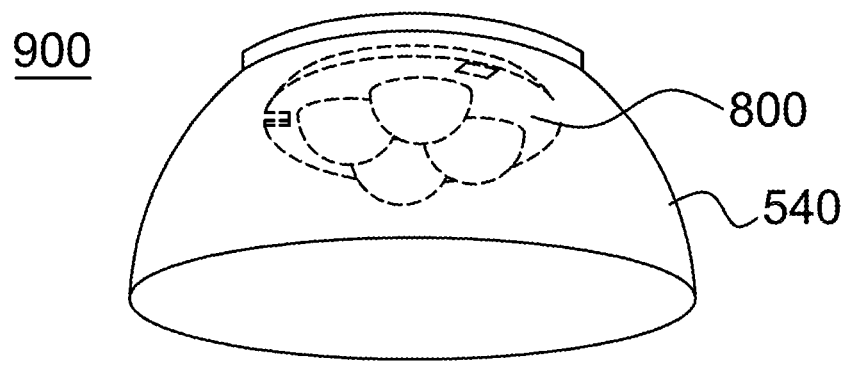
FIG. 6A and FIG. 6B show schematic views of a light generation apparatus.
Figure 6B:
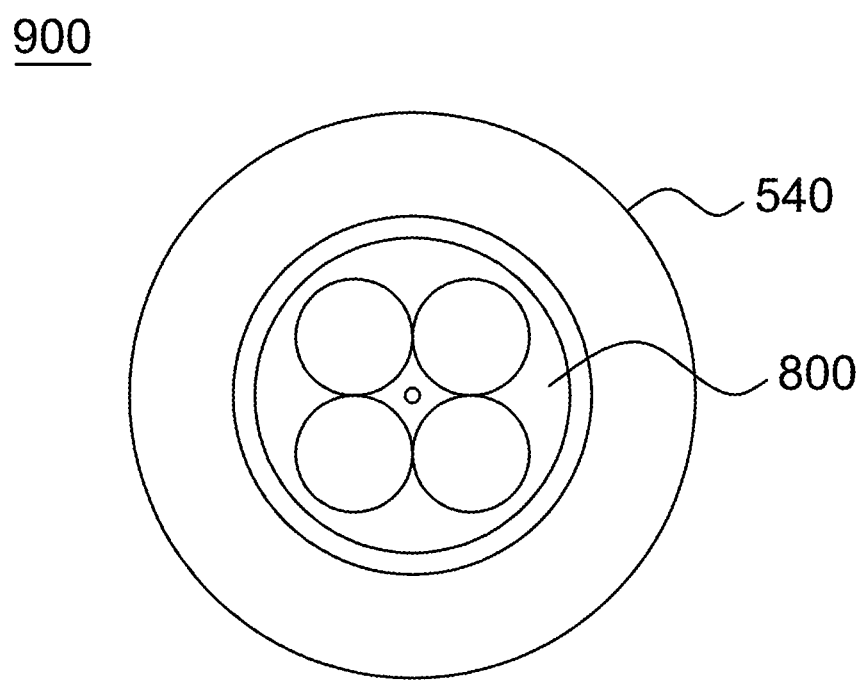

FIG. 6A and FIG. 6B show a light generation apparatus 900. The light generation apparatus 900 includes a light emitting module 800, a light emitting unit 540, a power supply system (not shown in the figures) to supply a current to the light emitting module 800, and a control device (not shown in the figures) to control the power supply system (not shown in the figures). The light generation apparatus 900 can be an illuminous apparatus, for example, a street lamp, a car headlamp, and an indoor light source, a traffic light, or a backlight of a backlight module of a display.

Figure 7:
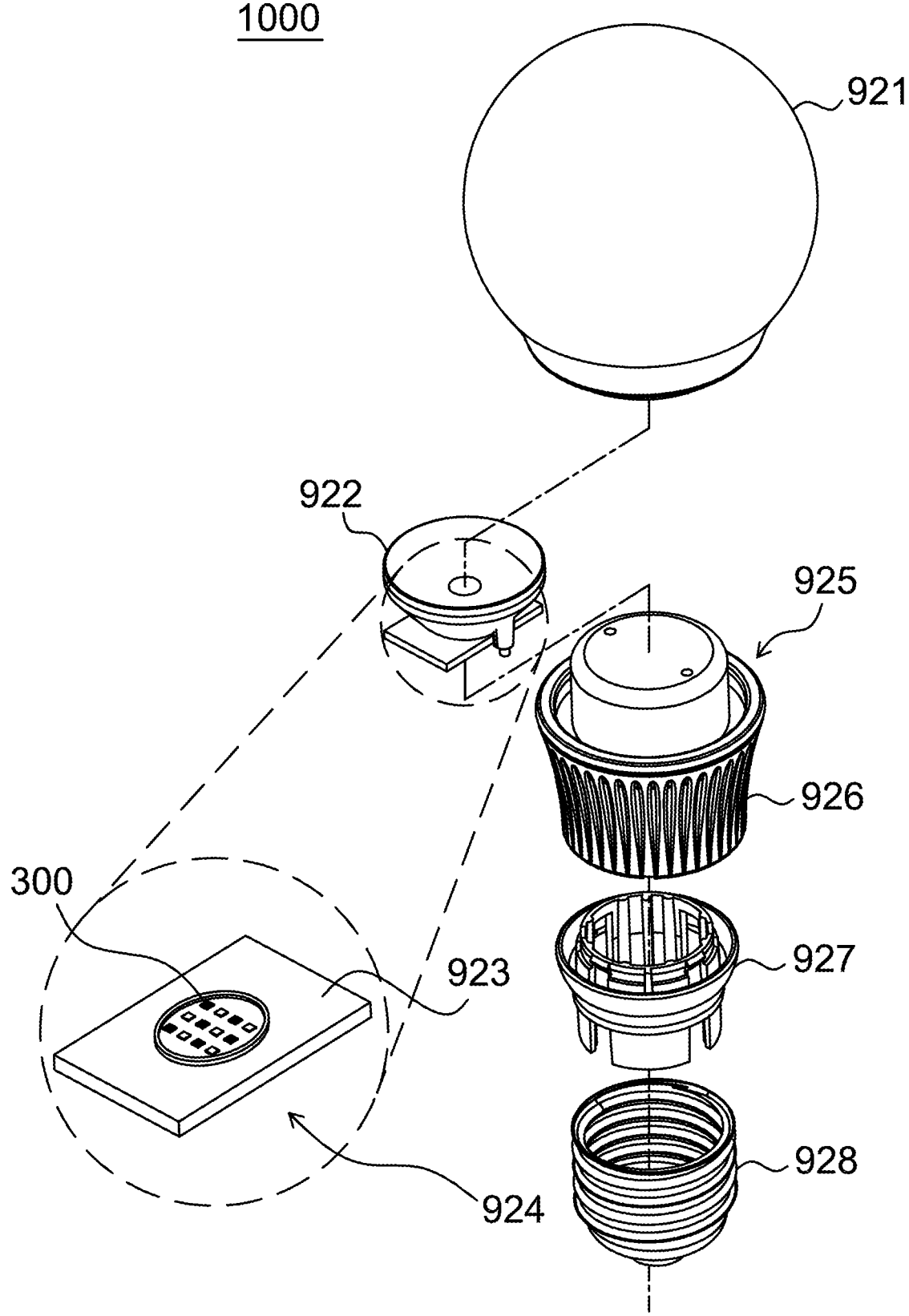
FIG. 7 shows a schematic view of a light bulb.

FIG. 7 shows a light bulb. The light bulb 1000 includes a shell 921, a lens 922, an illuminous module 924, a frame 925, a heat dissipater 926, a connecting portion 927, and an electrical connecting member 928. Herein the light emitting module 924 includes a carrier 923, and the carrier 923 includes one of the optoelectronic devices 300 of the aforementioned embodiments or other optoelectronic device in other embodiments (not shown in the figures).

Specifically, the substrate 30 is a base for growth or bearing. The substrate 30 can be a conductive substrate or non-conductive substrate, a light-transmitting substrate or a non-light-transmitting substrate. Herein a material of the conductive substrate can be Ge, GaAs, InP, SiC, Si, $LiAlO_2$, ZnO, GaN, AlN or metal. A material of the light-transmitting substrate can be Sapphire, $LiAlO_2$, ZnO, GaN, glass, diamond, CVD diamond, diamond-like carbon, spinel ($MgAl_2O_4$), $Al_2O_3$, $SiO_x$, and $LiGaO_2$.

An epitaxial stack 31 includes a first semiconductor layer 311, an active layer 312, and a second semiconductor layer 313. The first semiconductor layer 311 and the second semiconductor layer 313, for example, are cladding layers or confinement layers with a single structure, or a stacked structure. The first semiconductor layer 311 and the second semiconductor layer 313 are with different conductivities, different polarities, or different dopants. The polarities can be a combination of at least two of p-type, n-type or i-type for supplying electrons and holes respectively so that electrons and holes are combined in the active layer 312 to emit light. Materials of the first semiconductor layer 311, the active layer 312, and the second semiconductor layer 313 can include III-V semiconductor materials, for example, $Al_xIn_yGa_{(1-x-y)}N$ or $Al_xIn_yGa_{(1-x-y)}P$ wherein $0 \leq x$, $y \leq 1$ and $(x+y) \leq 1$. According to the material of the active layer 312, the epitaxial stack can emit a red light having a wavelength range of 610-650 nm, a green light having a wavelength range of 530-570 nm, a blue light having a wavelength range of 450-490 nm or an ultraviolet light having a wavelength small than 400 nm.

In another embodiment, the optoelectronic devices 300, 400, 500, 600, 700, and 700' can be an epitaxial device or a light emitting diode and their spectrums can be adjusted by altering physical or chemical constituents of the single layer semiconductor or multi-layer semiconductor. A material of the single layer semiconductor or the multi-layer semiconductor is composed of elements selected from a group consisting of Al, Ga, In, P, N, Zn, and O. A structure of the active layer 312 can be a single heterostructure (SH), a double heterostructure (DH), a double-side double heterostructure (DDH), a multi-quantum well (MQW). Moreover, a number of multi-quantum wells of the active layer 312 can change the wavelength of light.

In one embodiment, a buffer layer (not shown in the figures) can be optionally formed between the first semiconductor 311 and the substrate 30. The buffer layer is between two kinds of material systems for transferring the material system of the first semiconductor layer 311 to the material system of the substrate 30. For a structure of a light emitting diode, in one aspect, the buffer layer can reduce mismatch between two different materials. In another aspect, the buffer layer can combine two kinds of materials or two of separate single layers, stacked layers, or structures. A material of the buffer layer can be an organic material, an inorganic material, metal and a semiconductor, and a structure of the buffer layer can be a reflection layer, a heat conductive layer, an ohmic contact layer, an anti-deformation layer, a stress release layer, a stress adjustment layer, a boding layer, a wavelength conversion layer, and a mechanical fixing structure. In one embodiment, a material of the buffer layer can be selected from aluminum nitride or gallium nitride, and the buffer layer can be formed by sputtering or atomic layer deposition (ALD).

A contact layer can be optionally formed between the second semiconductor layer 313 and the second electrode 33. Specifically, the contact layer can be an optical layer, an electronic layer, or a combination thereof. The optical layer can change electromagnetic radiation rays or light emitting from or entering the active layer. The so-called "change" means at least one of optical characteristics of electromagnetic radiation rays or light is changed. The characteristics include, but are not limited to frequency, wavelength, intensity, flux, efficiency, color temperature, rendering index, light field, and angle of view. The electronic layer can change or make a trend of change in values, intensities, and distributions of at least one of voltages, resistors, currents, and capacities of opposite sides of the contact layer. A material of the contact layer includes oxide, conductive oxide, transparent oxide, oxide with transmittance of more than 50%, metal, a relative light-transmitting metal, metal with transmittance of more than 50%, an organic substance, an inorganic substance, a fluorescence substance, a phosphorescence substance, ceramic, a semiconductor, a doped semiconductor, and an undoped semiconductor. In some applications, a material of the contact layer can be indium tin oxide (ITO), cadmium tin oxide (CTO), antimony tin oxide (ATO), aluminum zinc oxide (AZO), and zinc tin oxide (ZTO). If the material is a relative light-transmitting metal, the preferred thickness is about 0.005 μm~0.6 μm.

The principle and the efficiency of the present application illustrated by the embodiments above are not the limitation of the present application. Any person having ordinary skill in the art can modify or change the aforementioned embodiments. Therefore, the protection range of the rights in the present application will be listed as the following claims.

What is claimed is:

1. An optoelectronic device, comprising:
   a first semiconductor layer comprising multiple first boundaries;
   a second semiconductor layer formed on the first semiconductor layer;
   an active layer formed between the first semiconductor layer and the second semiconductor layer;
   a second electrode formed on the second semiconductor layer and comprising multiple second boundaries;
   an insulating layer covering the second semiconductor layer and the second electrode, comprising a plurality of first openings formed on one of the multiple first boundaries;
   a third electrode formed on the insulating layer and electrically connected to the first semiconductor layer; and
   a fourth electrode formed on the insulating layer and electrically connected to the second semiconductor layer,
   wherein the third electrode comprises an edge away from the fourth electrode and adjacent to the one of the multiple first boundaries, and
   wherein a portion of the edge is on the second electrode and inward of one of the multiple second boundaries adjacent to the one of the multiple first boundaries and another portion of the edge is protruded from the portion of the edge and beyond the one of the multiple second boundaries to electrically connect to the first semiconductor layer via the plurality of first openings.

2. The optoelectronic device of claim 1, wherein the multiple first boundaries comprises two longer sides and two shorter sides.

3. The optoelectronic device of claim 1, wherein the plurality of first openings of the insulating layer is formed along the multiple first boundaries.

4. The optoelectronic device of claim 3, further comprising a plurality of first electrodes formed along the multiple boundaries.

5. The optoelectronic device of claim 4, wherein the plurality of first openings of the insulating layer is formed on the plurality of first electrodes.

6. The optoelectronic device of claim 1, wherein in a cross-sectional view of the optoelectronic device, the third electrode comprises a concave portion corresponding to one of the plurality of first openings of the insulating layer.

7. The optoelectronic device of claim 1, further comprising a first electrode formed on the first semiconductor layer.

8. The optoelectronic device of claim 7, wherein the first electrode comprises a shape projected on the first semiconductor layer comprising a polygon, a circle, an oval, a semi-circle, or a pattern having a cambered surface.

9. The optoelectronic device of claim 7, wherein the first electrode is formed on a corner constituted by two of the multiple first boundaries.

10. The optoelectronic device of claim 7, wherein the first electrode is formed along one of the multiple first boundaries.

11. The optoelectronic device of claim 10, wherein the first electrode comprises a head portion and a tail portion, and the head portion comprises a width larger than that of the tail portion.

12. The optoelectronic device of claim 7, further comprising a groove formed on the first semiconductor layer and surrounded by the second semiconductor layer, wherein the first electrode is formed in the groove.

13. The optoelectronic device of claim 1, wherein the third electrode and the fourth electrode are separated by a distance larger than 50 μm.

14. The optoelectronic device of claim 1, wherein the second electrode comprises a plurality of concave portions corresponding to the plurality of first openings of the insulating layer in the top view of the optoelectronic device.

15. The optoelectronic device of claim 1, further comprising a second adjustment layer formed between the second electrode and the fourth electrode.

16. The optoelectronic device of claim 1, wherein the insulating layer comprises a distributed bragg reflector (DBR) structure.

17. The optoelectronic device of claim 1, wherein the fourth electrode comprises two electrode parts, and a portion of the third electrode is formed between the two electrode parts.

18. The optoelectronic device of claim 17, wherein the insulating layer comprises a second opening, and the portion of the third electrode is formed on the second opening to electrically connect to the first semiconductor layer.

* * * * *